United States Patent [19]

Haraguchi et al.

[11] Patent Number: 5,446,692
[45] Date of Patent: Aug. 29, 1995

[54] SEMICONDUCTOR MEMORY DEVICE HAVING REDUNDANCY MEMORY CELLS SHARED AMONG MEMORY BLOCKS

[75] Inventors: Yoshiyuki Haraguchi; Koreaki Fujita; Kiyoyasu Akai, all of Hyogo, Japan

[73] Assignee: Mitsubishi Denki Kabushiki Kaisha, Tokyo, Japan

[21] Appl. No.: 8,109

[22] Filed: Jan. 25, 1993

[30] Foreign Application Priority Data

Feb. 14, 1992 [JP] Japan .................................. 4-028414

[51] Int. Cl.⁶ .................................................. G11C 13/00
[52] U.S. Cl. ............................... 365/200; 365/230.03
[58] Field of Search ............................ 365/200, 230.03

[56] References Cited

U.S. PATENT DOCUMENTS

| | | | |
|---|---|---|---|
| 4,601,019 | 7/1986 | Shah et al. | 365/200 |
| 4,807,191 | 2/1989 | Flannagan | 365/189 |
| 5,021,944 | 6/1991 | Sasaki et al. | 365/200 |
| 5,134,583 | 7/1992 | Matsuo et al. | 365/200 |
| 5,233,559 | 8/1993 | Brennan, Jr. | 365/200 |
| 5,293,348 | 3/1994 | Abe | 365/200 X |
| 5,295,101 | 3/1994 | Stephens, Jr. et al. | 365/200 |

FOREIGN PATENT DOCUMENTS

| | | |
|---|---|---|
| 60-130139 | 7/1985 | Japan . |
| 62-153700 | 9/1987 | Japan . |
| 62-217498 | 9/1987 | Japan . |
| 1-276496 | 11/1989 | Japan . |
| 2-177088 | 7/1990 | Japan . |
| 3-80500 | 4/1991 | Japan . |
| 3-93097 | 4/1991 | Japan . |

*Primary Examiner*—Do Hyun Yoo
*Attorney, Agent, or Firm*—Lowe, Price, LeBlanc & Becker

[57] ABSTRACT

An improved SRAM is disclosed including a plurality of memory blocks each having a redundancy memory cell to be shared. In redundancy row decoders 50a, 50b, 50c provided in each memory block, a memory block to be remedied is programmed. Accordingly, a redundancy memory cell row corresponding to each redundancy row decoder can be used for remedy of a defect memory cell in another memory block. Since a defect memory cell may be remedied flexibly, the yield rate in production of semiconductor memories is improved.

3 Claims, 18 Drawing Sheets

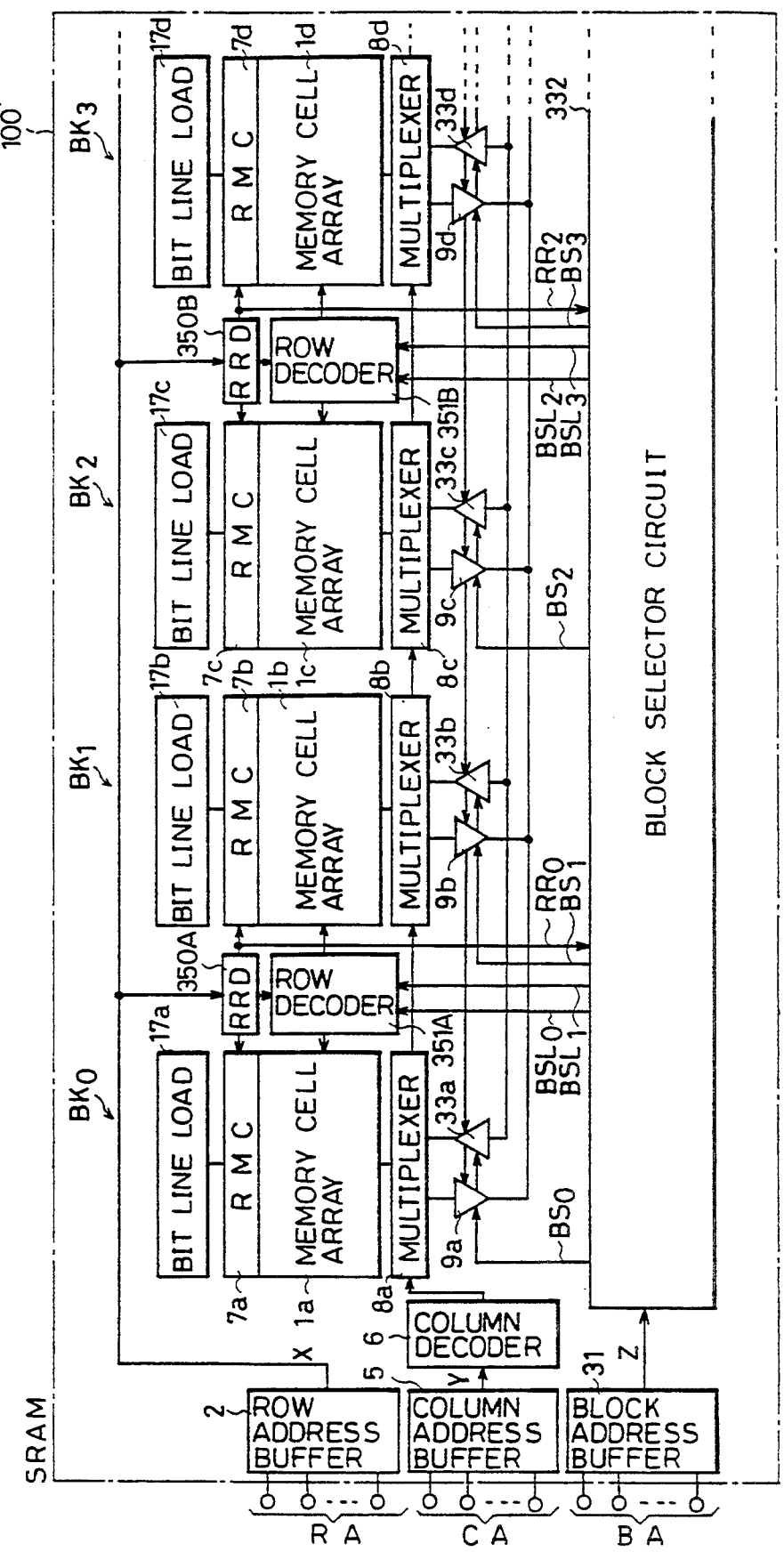

SEMICONDUCTOR MEMORY DEVICE HAVING REDUNDANCY MEMORY CELLS SHARED AMONG MEMORY BLOCKS

CROSS-REFERENCE TO RELATED, COPENDING APPLICATION

Related, copending application of particular interest to the instant application is U.S. Ser. No. 07/945,179, entitled "Semiconductor Memory Device Including Redundancy Circuit", filed Sep. 15, 1992, now abandoned and assigned to the same assignee of the instant application.

BACKGROUND OF THE INVENTION

1. Field of the Invention

The invention relates generally to semiconductor memory devices, and more particularly, to a semiconductor memory device including a plurality of memory blocks each having redundancy memory cells for sharing. The invention has particular applicability to static random access memories (SRAMs).

2. Description of the Background Art

A semiconductor memory such as a static random access memory (hereinafter referred to as an SRAM) and a dynamic random access memory (hereinafter referred to as a DRAM) has been conventionally provided with a redundancy circuit for improving the yield rate in production. When a defect exists in a manufactured semiconductor memory, the semiconductor memory is remedied by the function of the redundancy circuit. In other words, in a conventional semiconductor memory, a row or column including a defective memory cell is replaced with a predetermined spare row or column functionally.

In general, defects in a semiconductor memory tend to be generated in adjacent rows (or memory cell rows) in a memory cell array. For example, two word lines in two adjacent memory cell rows are shorted, bringing the two adjacent memory rows to the "defective" state. This means that it is often necessary to remedy two or more adjacent memory cell rows. The present invention also proceeds this tendency in a semiconductor memory, and provides a countermeasure for the remedy (the second and fourth embodiments which will be described hereinafter). Although the present invention can generally be applied to a semiconductor memory such as an SRAM, a DRAM and the like, a case where the present invention is applied to an SRAM will be described as an example.

FIG. 8 is a block diagram of an SRAM showing the background of the present invention. Referring to FIG. 8, an SRAM 500 includes n memory blocks BK0 to BKn−1, and a block selector circuit 532 for selecting a memory block to be accessed. One of memory blocks BK0 to BKn−1, for example, the memory block BK0, includes a memory cell array 1a, a redundancy memory cell row (RMC) 7a, a row decoder 503a, a redundancy row decoder (RRD) 550a, a bit line load circuit 17a connected to a bit line, a multiplexer 8a for selecting a bit line pair to be accessed, a sense amplifier 9a for reading data, and a write buffer 33a for writing data. In an example where the SRAM 500 has 4-megabit storage capacity, 64 memory blocks BK0 to BK63 in total are provided.

The SRAM 500 further includes a row address buffer 2 for receiving an externally applied row address signal RA, a column address buffer 5 for receiving an externally applied column address signal CA, a block address buffer 31 for receiving an externally applied block address signal BA, a column decoder 6 for decoding a column address signal Y applied from column address buffer 5, a data input buffer 13 for receiving input data Di, a data output buffer 10 for providing output data Do, and a read/write control circuit 16 for operating in response to an externally applied chip selecting signal CS and a read/write control signal RWC.

In the SRAM 500 shown in FIG. 8, a block address signal for selecting memory blocks BK0 to BKn−1 is externally applied through the block address buffer 31. However, some cases are known where a part of row address signals RA is used for selecting blocks.

The block selector circuit 532 provides block selecting signals BS0 to BSn−1 for selecting memory blocks BK0 to BKn−1 in response to a signal Z provided from the block address buffer 31. Block selecting signals BS0 to BSn−1 are applied to corresponding row decoders and sense amplifiers in corresponding memory blocks BK0 to BKn−1, respectively. The corresponding row decoders and sense amplifiers are operated in response to activated block selecting signals.

Ordinary access operation will now be described. When the memory block BK0, for example, is accessed, the activated block selecting signal BS0 is applied to a row decoder 503a and a sense amplifier 9a. In reading data, a memory cell, not shown, in the memory cell array 1a is designated by the row decoder 503a and the column decoder 6. A data signal stored in the designated memory cell is applied to the sense amplifier 9a through the multiplexer 8a. A data signal amplified by the sense amplifier 9a is provided as output data Do through the data output buffer 10.

In the write operation, input data Di is applied to the write buffer 33a through the data input buffer 13. Write buffer 33a applies the applied data signal to the memory cell array 1a through the multiplexer 8a in response to the activated block selecting signal BS0 and a control signal applied from the read/write control circuit 16. Therefore, the data signal is written in a memory cell designated by the row decoder 503a and the column decoder 6.

When it is found that some defect exists in one memory cell row in the memory cell array 1a, the defective memory cell is replaced with the redundancy memory cell row 7a functionally as described hereinafter. A defective memory cell address indicating the position of the defective memory cell row is programmed by selectively disconnecting a fuse (not shown) provided in the redundancy row decoder 550a. Therefore, when access is requested for a row having a defective memory cell, the redundancy memory cell row 7a is accessed in place of the defective memory cell row, because of the function of the redundancy row decoder 550a. In other words, the defective memory cell row is replaced with the redundancy memory cell row 7a electrically or functionally. Operation of these redundancy circuits for remedy of a defective memory cell will be described in detail later.

FIG. 9 is a schematic diagram of a circuit of the memory cell array 1a shown in FIG. 8. Referring to FIG. 9, for simplicity of depiction, only four memory cells 24a to 24d in the memory cell array 1a are shown. Memory cells 24a and 24c are connected between bit lines 20a and 20b. Memory cells 24b and 24d are connected between bit lines 21a and 21b.

The bit line load circuit 17a includes NMOS transistors 25a, 25b, 26a and 26b each connected between a power supply potential Vcc and a corresponding one of bit lines 20a, 20b, 21a and 21b. On the other hand, the multiplexer 8a includes NMOS transistors 27a, 27b, 28a and 28b connected between I/O line pair 29a, 29b and bit lines 20a, 20b, 21a and 21b. I/O line pair 29a and 29b are connected to an input of the sense amplifier 9a and an output of the write buffer 33a.

The row decoder 503a selectively activates one of word lines WL0 and WL1 connected to a memory cell to be accessed. Memory cells 24a and 24b connected to a word line WL0 configure a memory cell row. When the word line WL0 is activated, a memory cell row including memory cells 24a and 24b is accessed. On the other hand, the column decoder 6 activates one of column selecting signals Y0 and Y1 for selecting a memory cell column to be accessed. When the column selecting signal Y0, for example, is activated, a memory cell column including memory cells 24a and 24c is accessed, since transistors 27a and 27b are turned on.

FIG. 10 is a schematic diagram of a circuit showing one example of the memory cell shown in FIG. 9. Referring to FIG. 10, the memory cell MC1 (for example, 24a of FIG. 9) includes NMOS transistors 41a and 41b, resistances 43a and 43b as high resistance loads, and NMOS transistors 42a and 42b as access gates.

FIG. 11 is a schematic diagram of a circuit showing another example of the memory cell shown in FIG. 9. Referring to FIG. 11, the memory cell MC2 includes NMOS transistors 41a and 41b, PMOS transistors 44a and 44b operating as loads, and NMOS transistors 42a and 42b as access gates.

FIG. 12 is a timing chart far explaining read operation of the memory cell 24a shown in FIG. 9. Referring to FIG. 12, the abscissa indicates time, and the ordinate indicates potential (volt). Lines ADi indicate change of input signals of the row address buffer 2 and the column address buffer 5. Lines ADo indicate change of output signals of the row and column address buffers 2 and 5. Lines WL indicate change of the word line WL0 connected to the memory cell 24a. Lines I/O indicate change of the I/O line pair 29a and 29b. Lines SAo indicate change of the output voltage of the sense amplifier 9a. Lines Do indicate change of output signals of the data output buffer 10.

At time t0, an input address signal ADi is changed. Therefore, output signals ADo of the address buffers 2 and 5 are changed at time t1. At time t2, since the potential of the word line WL0 changes, a data signal stored in the memory cell 24a is transmitted to bit line pair 20a, 20b. In addition to this, since the column selecting signal Y0 provided from the column decoder 6 attains a high level, transistors 27a and 27b are turned on. Therefore, at time t3, the potential of I/O line pair 29a and 29b is changed.

At time t4, since the sense amplifier 9a is activated in response to a control signal applied from the read/write control circuit 16, a data signal is amplified by the sense amplifier 9a. Therefore, at time t5, an output signal Do of the data output buffer 10 is changed in accordance with data read out of the memory cell 24a.

FIG. 13 is a schematic diagram of the block selector circuit 532 shown in FIG. 8. Referring to FIG. 13, the block selector circuit 532 includes NAND gates 100a to 100d for selectively receiving two of signals Z0 and Z1 provided from the block address buffer 31 and their inverted signals /Z0 and /Z1, respectively, and inverters 101a to 101d. Although the SRAM 500 shown in FIG. 8 includes n memory blocks, for simplicity of depiction and description, the block selector circuit 532 shown in FIG. 13 shows a circuit for selecting one of four memory blocks. Input signals Z0,/Z0, Z1 and/Z1 can be obtained from lower two bits of the externally applied block address signal BA. Inverters 101a to 101d provide block selecting signals BS0 to BS3, respectively.

Operation of the block selector circuit 532 will now be described. A case where the memory block BK0 is selected will be described as an example. The block address signal BA designating the memory block BK0 is externally applied to the block address buffer 31 shown in FIG. 8. The block address buffer 31 provides low level signals Z0 and Z1, and high level signals /Z0 and /Z1. Therefore, only the NAND gate 100a shown in FIG. 13 provides a low level signal, while other NAND gates 100b, 100c and 100d provide high level signals. As a result, only the block selecting signal BS0 attains a high level (is activated), while other block selecting signals BS1 to BS3 are retained at a low level.

FIG. 14 is a block diagram of a circuit of the row decoder 503a and the redundancy row decoder 550a shown in FIG. 8. The circuit shown in FIG. 14 is only a portion of the circuit for accessing four memory cell rows and one redundancy memory cell row in the memory cell array 1a. It is pointed out that row decoders 503b and 503c and redundancy row decoders 550b and 550c provided in other memory blocks BK1 to BKn−1 shown in FIG. 8 have the same circuit configurations as those shown in FIG. 14.

Referring to FIG. 14, the row decoder 503a includes NAND gates 55a to 55d for selectively receiving signals X0 and X1 provided from the row address buffer 2 shown in FIG. 8 and their inverted signals /X0 and /X1, respectively, and inverters 56a to 56d. In addition, NAND gates 55a to 55d are connected to also receive the block selecting signal BS0 provided from the block selector circuit 532. Outputs of inverters 56a to 56d are connected to word lines WL0 to WL3, respectively. Input signals X0 and X1 and their inverted signals /X0 and /X1 can be obtained from lower two bits of the externally applied row address signal RA.

The redundancy row decoder 550a includes a redundancy enable circuit 51 for activating the redundancy row decoder 550a itself, address program circuits 52a and 52b for programming a defective row address defining a memory cell row having a defective memory cell, an NAND gate 55e, and an inverter 56e. An output of the inverter 56e is connected to a word line WLR for accessing a redundancy memory cell row (which corresponds to the circuit 7a shown in FIG. 8). The NAND gate 55e is connected to receive redundancy enable signals RE, Sa and Sb provided from the redundancy enable circuit 51, address program circuits 52a and 52b, respectively, and the block selecting signal BS0.

FIG. 15 is a schematic diagram of the redundancy enable circuit. The redundancy enable circuit 51 shown in FIG. 14 can be implemented by the circuit 51 shown in FIG. 15. Referring to FIG. 15, the redundancy enable circuit 51 includes a capacitor 71, a resistance 72, and a PMOS transistor 74 connected in parallel between a power supply potential Vcc and a node 70, a fuse 73 for a program connected between the node 70 and the ground, and cascaded inverters 75 and 76.

When the redundancy circuit is used, that is, when a defective memory cell exists in the memory cell array, the fuse 73 is disconnected. Therefore, since the node 70 is retained at a high level, i.e., the power supply potential Vcc, a high level redundancy enable signal RE is provided through the inverter 76. On the other hand, when the redundancy circuit is not used, that is, when no defective memory cell exists in the memory cell array, the fuse 73 is not disconnected. Therefore, since the potential of the node 70 is retained at a low level, i.e., the ground level, a low level redundancy enable signal RE is provided.

FIG. 16 is a schematic diagram of an address program circuit. Address program circuits 52a and 52b shown in FIG. 14 can be implemented by using the circuit 52 shown in FIG. 16. Referring to FIG. 16, the address program circuit 52 includes a capacitor 61, a resistance 62, and a PMOS transistor 64 connected in parallel between the power supply potential Vcc and a node 60, a fuse 63 for a program connected between the node 60 and the ground, cascaded inverters 65 and 66, and two CMOS transmission gates TG1 and TG2. The transmission gate TG1 passes an input signal /X in response to the potential of a node 67. On the other hand, the transmission gate TG2 passes an input signal X in response to the potential of the node 67. One of input signals X and /X is provided as an output signal S in response to connection or disconnection of the fuse 63.

In operation, when the fuse 63 is disconnected, the potential of the node 60 is retained at a high level. Since, the potential of the node 67 is fixed at a level lower than that of the inverter 65, the transmission gate TG2 is turned on, causing the input signal X to be transmitted as an output signal S. Conversely, when the fuse 63 is connected, since the potential of the node 60 is retained at a low level, the potential of the node 67 is retained at a high level. Therefore, the transmission gate TG1 is turned on, whereby the input signal /X is transmitted as an output signal S.

Description will be given hereinafter of operation of the redundancy row decoder 550a shown in FIG. 14 to which circuits shown in FIGS. 15 and 16 are applied. Description will be given first to a case where no defect memory cell exists in the memory cell array 1a, that is, where the redundancy memory cell row 7a is not accessed. In this case, a fuse in the redundancy enable circuit 51 (which corresponds to the fuse 73 shown in FIG. 15) is not disconnected. Therefore, the low level redundancy enable signal RE is applied to the NAND gate 55e. Since an output signal of the NAND gate 55e is retained at a high level, the inverter 56e provides a low level redundancy word line signal WLR, causing the redundancy memory cell row 7a not to be accessed.

NAND gates 55a to 55d in the row decoder 503a receive a high level output signal of the NAND gate 55e and a high level block selecting signal BS0. Therefore, NAND gates 55a to 55d selectively activate one of word lines WL0 to WL3 (that is, selectively bring it to a high level) in response to signals X0, /X0, X1 and /X1 applied from the row address buffer 2. Therefore, a memory cell row connected to the activated word line can be accessed.

When a defective memory cell exists in the memory cell array 1a, that is, when replacement by the defective memory cell row 7a is employed, a fuse in the redundancy enable circuit 51 is disconnected, causing the high level redundancy enable signal RE to be applied to the NAND gate 55e. In addition to this, a row having a defective memory cell, that is, a row address defining the defective memory cell row, is programmed by selectively disconnecting fuses in address program circuits 52a and 52b.

Assuming that a defective memory cell exists in a memory cell row connected to the word line WL0, a program for defining this memory cell row is carried out. In other words, in respective address program circuits 52a and 52b, the program is carried out by leaving the corresponding fuse 63 connected. As a result, the address program circuit 52a provides the input signal /X0 as output signal Sa. On the other hand, the address program circuit 52b provides the input signal /X1 as output signal Sb. In both cases, when high level input signals /X0 and X1 are applied, high level output signals Sa and Sb are applied to the NAND gate 55e. As a result, since the NAND gate 55e provides a low level signal, the inverter 56e provides the high level redundancy word line signal WLR. The redundancy memory cell row 7a is accessed in response to the high level redundancy word line signal WLR. In addition to this, since a low level output signal of the NAND gate 55e is applied also to the NAND gate 55a, the NAND gate 55a is disabled. In other words, the memory cell row connected to the word line WL0 cannot be accessed at this time.

As another example, when a defective memory cell exists in the memory cell row connected to the word line WL1, the corresponding fuse 63 in the address program circuit 52a is disconnected, and the corresponding fuse 63 in the address program circuit 526 is left connected. As a result, the NAND gate 55e is enabled when high level signals X0 and /X1 are applied, thereby activating the redundancy word line WLR.

In the above description, although programming for selecting one of four memory cell rows has been described, a number of memory cell rows are included in the memory cell array 1a in practice. Therefore, it is pointed out that address program circuits can be additionally provided in accordance with the number of memory cell rows.

As described above, a redundancy row decoder, for example, 550a can be used only for remedying a defective memory cell row which exists in the memory cell array 1a of one memory block BK0. In other words, referring to FIG. 8, although the redundancy memory cell row 7a in the memory cell block BK0 can be replaced with a defective memory cell row in the memory cell array 1a electrically or functionally, the redundancy memory cell row 7a cannot remedy a defective memory cell row which exists in the memory cell array 1b of another memory block, for example, BK1.

From the viewpoint of high integration, a conventional SRAM is generally provided with one or two redundancy memory cells or columns for a memory cell array. This means that when more than two defective memory cell rows or columns exist in one memory cell array, it is impossible to remedy them. Statistically, a defective portion in a semiconductor memory tends to be concentrated in one memory block. However, since only one or two redundancy memory cell rows or columns per a memory block were provided, it was difficult to effectively remedy many defective semiconductor memories. Therefore, SRAMs which are not remedied were to be discarded, causing lowering of the yield rate in production of semiconductor memories.

SUMMARY OF THE INVENTION

One object of the present invention is to improve the yield rate in production of semiconductor memory devices having a plurality of memory blocks.

Another object of the present invention is to improve the yield rate in production of static random access memories having a plurality of memory blocks.

Briefly, the semiconductor memory device according to the present invention includes a plurality of memory blocks each having a memory cell array and a redundancy memory cell, a plurality of redundancy access control circuits each provided for a corresponding redundancy memory cell in the plurality of memory blocks and controlling access to the corresponding redundancy memory cell. Each redundancy access control circuit includes a block address storage circuit for storing a block address indicating a defective memory block including a defective memory cell to be electrically replaced with a corresponding redundancy memory cell, a memory cell address storage circuit for storing a memory cell address indicating the position of the defective memory cell in the defective memory block, a block address coincidence detecting circuit for detecting coincidence between an applied block address and the block address stored in the block address storage circuit, a memory cell address coincidence detecting circuit for detecting coincidence between an applied memory cell address and the memory cell address stored in the memory cell address storage circuit, and a redundancy access enable circuit for enabling access to the corresponding redundancy memory cell in response to output signals provided from the block address coincidence detecting circuit and the memory cell address coincidence detecting circuit.

In operation, for each redundancy memory cell, it is possible to designate a memory block to be remedied by using said redundancy memory cell. In other words, since a redundancy access control circuit provided for each redundancy memory cell includes a block address storage circuit for storing a block address, a redundancy memory cell provided in one memory block can be used for remedy of a defective memory cell which exists in another memory block. Therefore, in a semiconductor memory device including a plurality of memory blocks, the yield rate in production can be improved.

According to another aspect of the present invention, a static random access memory includes a plurality of memory blocks which can be selectively accessed in response to an applied block selecting signal. Each memory block includes a memory cell array having a plurality of memory cells arranged in rows and columns, a redundancy memory cell row having a plurality of redundancy memory cells formed in parallel with a row of a corresponding memory cell array, and a redundancy access control circuit for controlling access to a corresponding redundancy memory cell row. Each redundancy access control circuit includes a block signal storage circuit for storing a block signal indicating a memory block including a defective memory cell row to be replaced electrically with a corresponding redundancy memory cell row, a row address storage circuit for storing a row address indicating the position of the defective memory cell row in the memory block, a block coincidence detecting circuit for detecting coincidence between an applied block selecting signal and the block signal stored in the block signal storage circuit, a row address coincidence detecting circuit for detecting coincidence between an applied row address signal and the row address signal stored in the row address storage circuit, and a redundancy access enable circuit for enabling access to a corresponding redundancy memory cell in response to output signals provided from the block coincidence detecting circuit and the row address coincidence detecting circuit.

According to still another aspect of the present invention, a semiconductor memory device includes a plurality of memory blocks each including a memory cell array and first and second redundancy memory cell rows, and a plurality of redundancy access control circuits each provided for corresponding the first and second redundancy memory cell rows in a corresponding one of the memory blocks and controlling access to the corresponding the first and second redundancy memory cell rows. Each redundancy access control circuit includes a circuit for functionally replacing two adjacent memory cell rows including at least one defective row with the corresponding the first and second redundancy memory cell rows in a memory cell array in a memory cell block excluding the corresponding one of the memory blocks.

According to a further aspect of the present invention, a semiconductor memory includes a plurality of memory blocks each including a memory cell array and a redundancy memory cell row, and a plurality of redundancy access control circuits each provided for corresponding two of the redundancy memory cell rows in corresponding two of the memory blocks and controlling access to the corresponding two of the redundancy memory cell rows. Each redundancy access control circuit includes a circuit for functionally replacing two memory cell rows including at least one defective row and each located in a corresponding one of the memory cell arrays with corresponding two of the redundancy memory cell rows in two memory cell arrays in two memory blocks excluding the corresponding two of the memory blocks.

According to a further aspect of the present invention, a semiconductor memory device includes a plurality of memory blocks each including a memory cell array and first and second redundancy memory cell rows, and a plurality of redundancy access control circuit each provided for corresponding four of the redundancy memory cell rows in corresponding two of the memory blocks and controlling access to the corresponding four of the redundancy memory cell rows. Each redundancy access control circuit includes a circuit for functionally replacing four memory cell rows including two sets of two memory cell rows each including at least one defective row and located adjacent to each other in a corresponding one of the memory cell arrays with corresponding four of the first and second redundancy memory cell rows in two memory cell arrays in two memory blocks excluding the corresponding two of the memory blocks.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 23 is a block diagram of an SRAM showing the third embodiment of the present invention.

DESCRIPTION OF THE PREFERRED EMBODIMENTS

In the following description, detailed circuits in a first to a fourth embodiment in accordance with the present invention will be disclosed. Prior to that, the remedy manners of defective memory cell rows in these embodiments will be described with reference to FIGS. 17 to 20. "X"s shown in FIGS. 17 to 20 show that a defect exists in a corresponding one of the memory cell rows.

Figure 17:
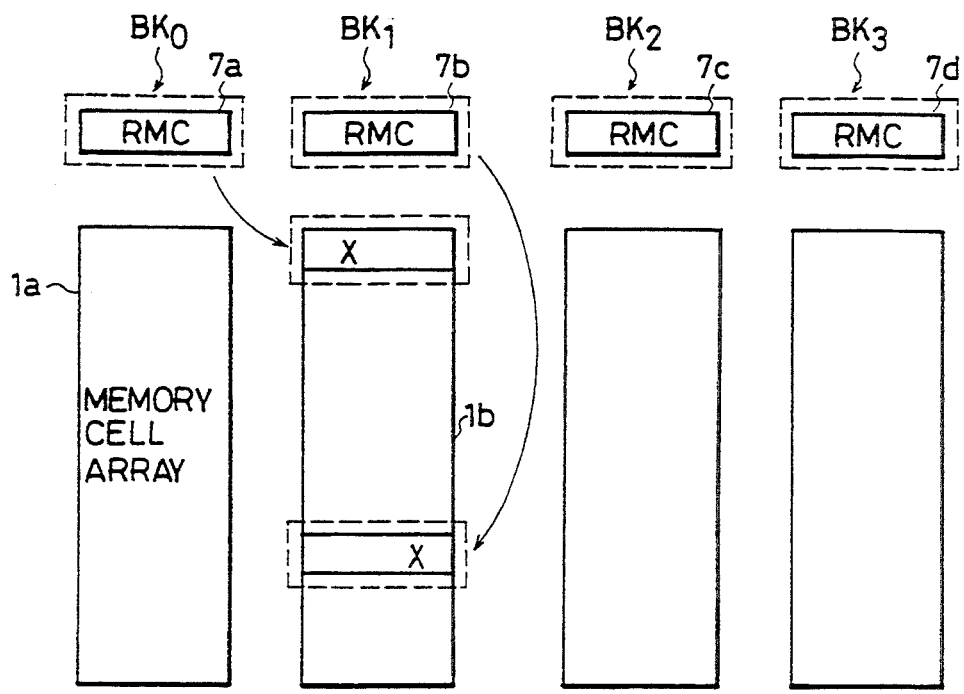
FIG. 17 is a concept diagram showing the remedy manner of defective memory cell rows in a first embodiment of the present invention.

Referring to FIG. 17, an SRAM of the first embodiment includes memory blocks BK0 to BK3 including redundancy memory cell rows 7a to 7d, respectively. A memory cell array 1b having two defective memory cell rows is remedied by two redundancy memory cell rows 7a and 7b in two memory blocks BK0 and BK1, respectively.

Figure 18:
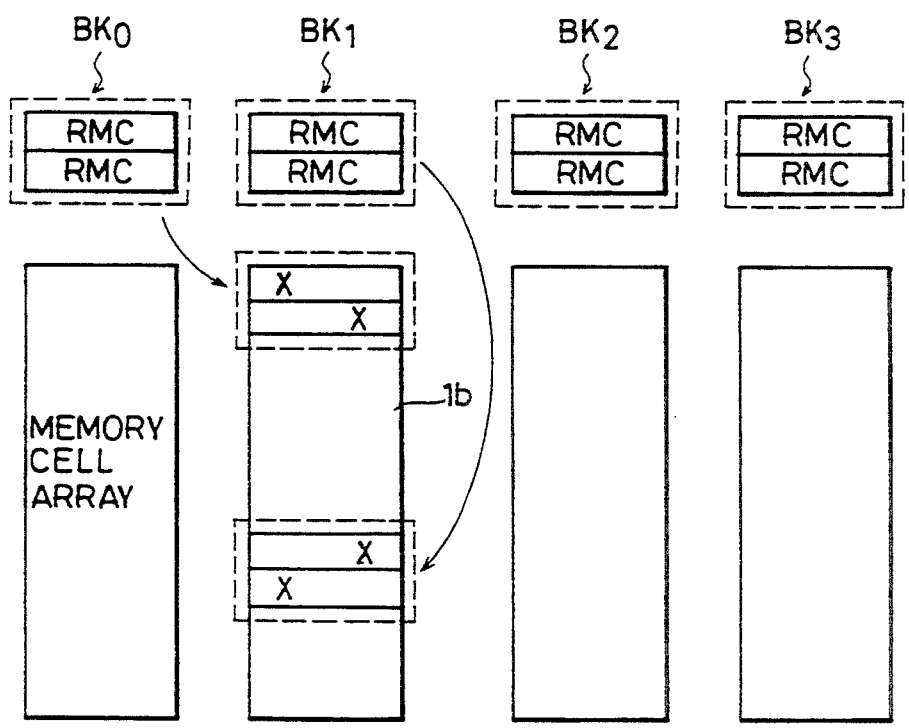
FIG. 18 is a concept diagram showing the remedy manner of defective memory cell rows in a second embodiment of the present invention.

Referring to FIG. 18, an SRAM of the second embodiment includes memory blocks BK0 to BK3 each including two redundancy memory cell rows. The memory cell array 1b having two sets of two defective and adjacent memory cell rows is remedied by four redundancy memory cell rows in two memory blocks BK0 and BK1.

Figure 19:
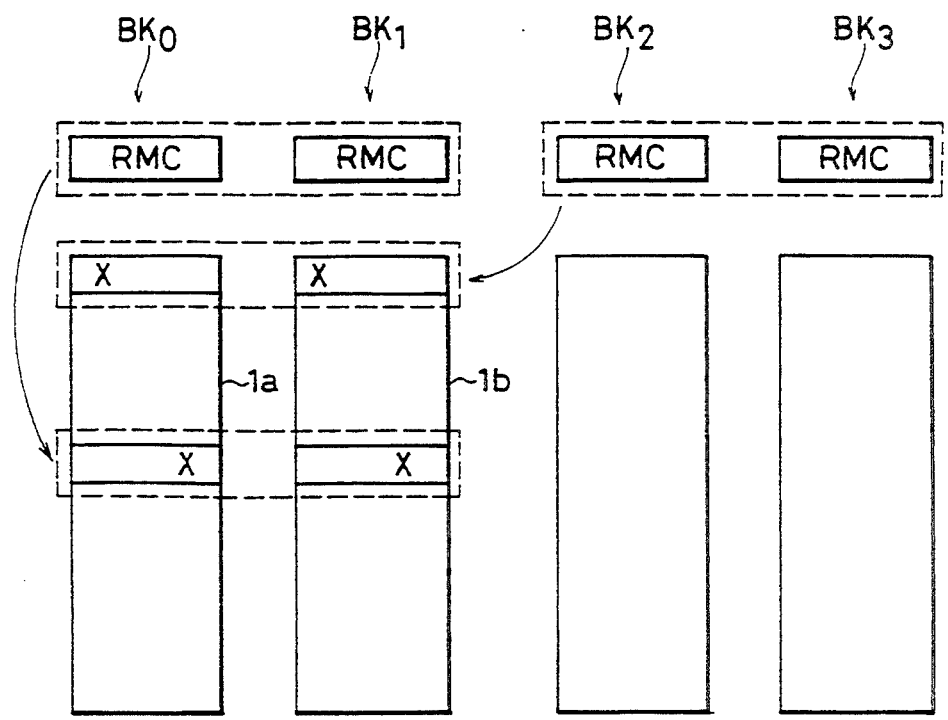
FIG. 19 is a concept diagram showing the remedy manner of defective memory cell rows in a third embodiment of the present invention.

Referring to FIG. 19, an SRAM of the third embodiment includes memory blocks BK0 to BK3 each including a redundancy memory cell row. The memory arrays 1a and 1b each having two defective memory cell rows are remedied by four redundancy memory cell rows in four memory blocks BK0 to BK3.

Figure 20:
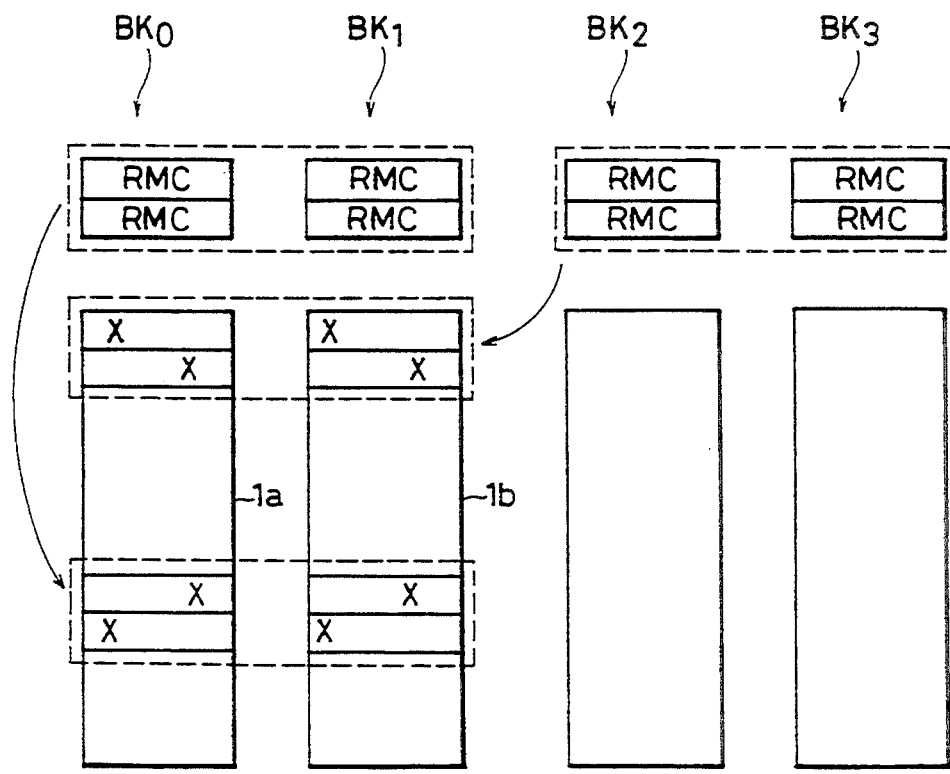
FIG. 20 is a concept diagram showing the remedy manner of defective memory cell rows in a fourth embodiment of the present invention.

Referring to FIG. 20, an SRAM of the fourth embodiment includes memory blocks BK0 to BK3 each including two redundancy memory cell rows. The memory cell arrays 1a and 1b each having two sets of two defective and adjacent memory cell rows are remedied by eight redundancy memory cell rows in four memory blocks BK0 to BK3.

Figure 1:
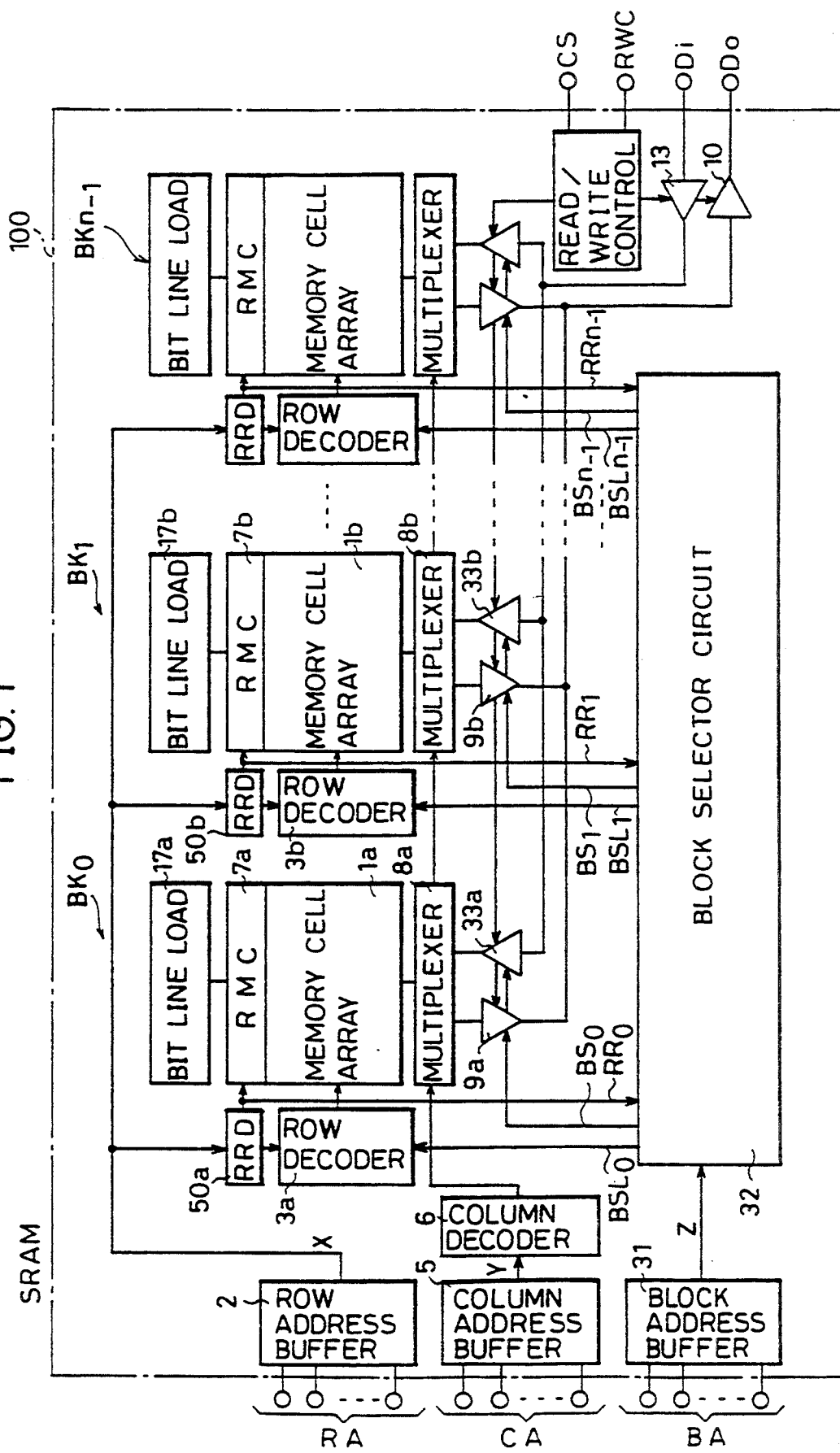
FIG. 1 is a block diagram of an SRAM showing a first embodiment of the present invention.
Figure 8:
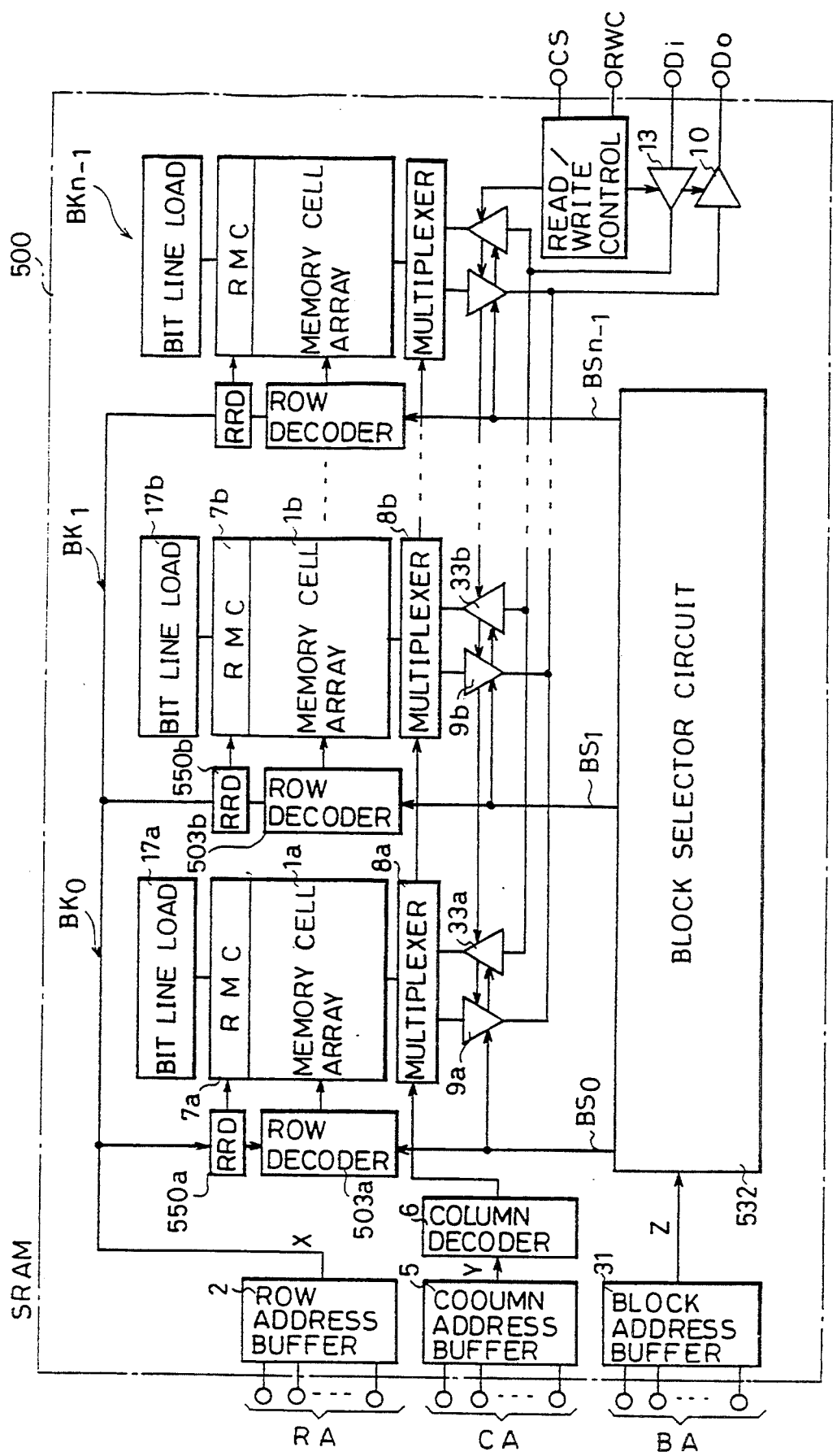
FIG. 8 is a block diagram of an SRAM showing the background of the present invention.
Figure 9:
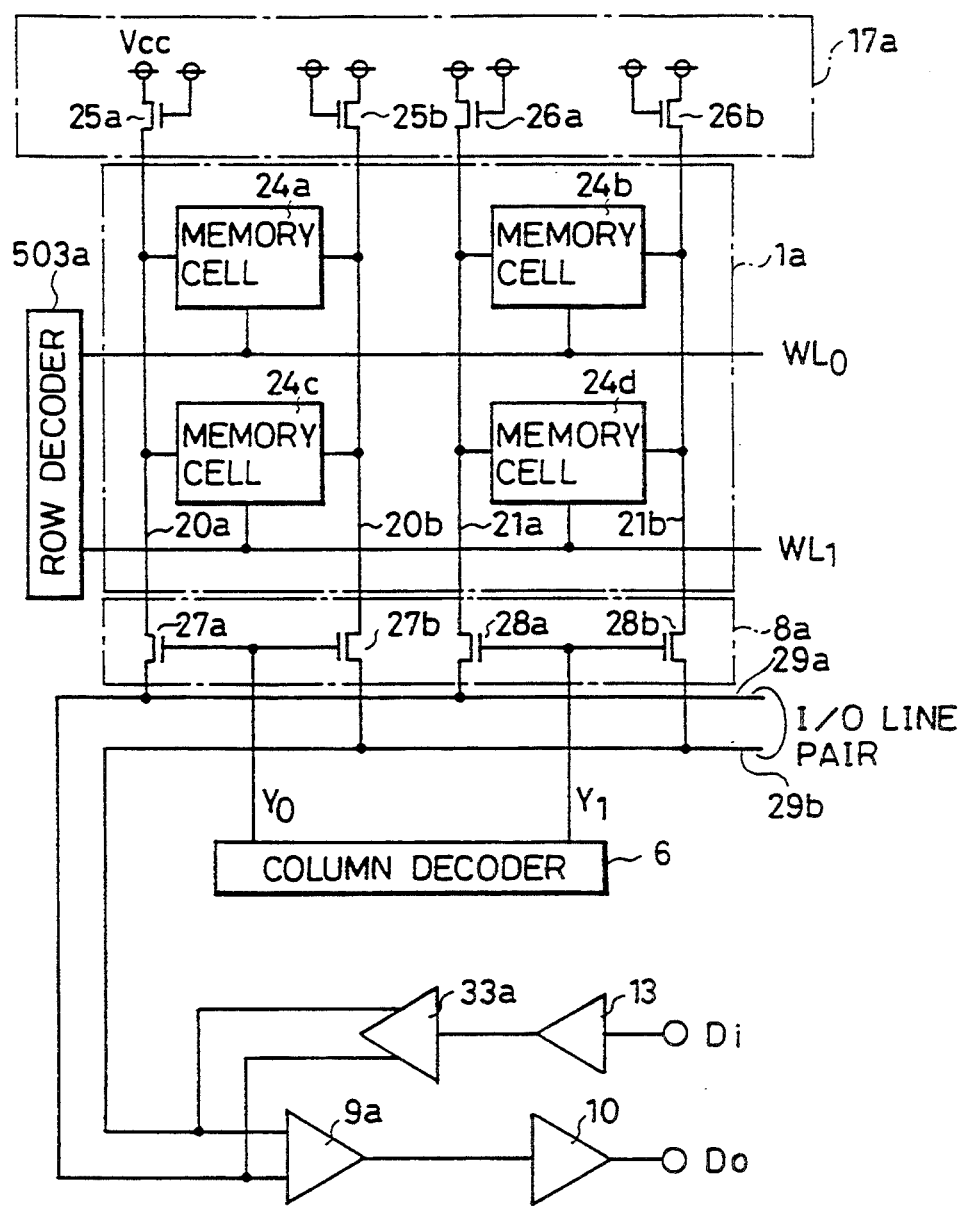
FIG. 9 is a schematic diagram of a circuit of memory cell array 1a shown in FIG. 8.
Figure 10:
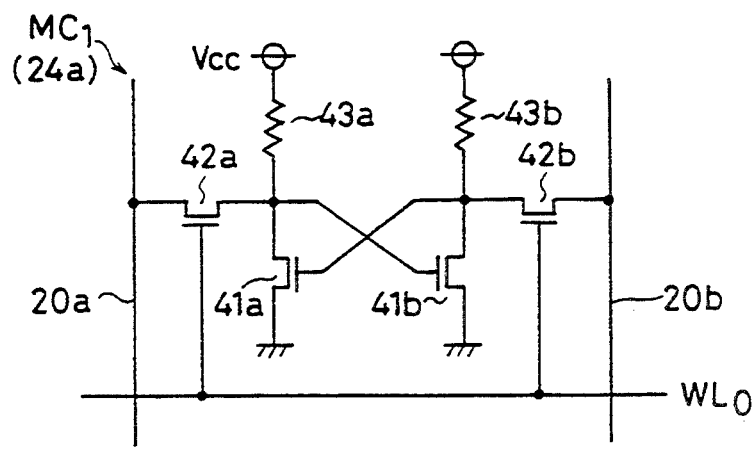
FIG. 10 is a schematic diagram of a circuit showing one example of a memory cell shown in FIG. 9.
Figure 11:
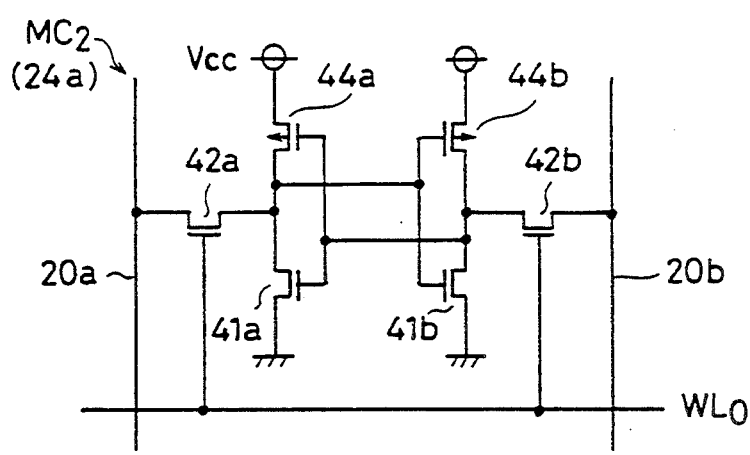
FIG. 11 is a schematic diagram of a circuit showing another example of the memory cell shown in FIG. 9.
Figure 12:
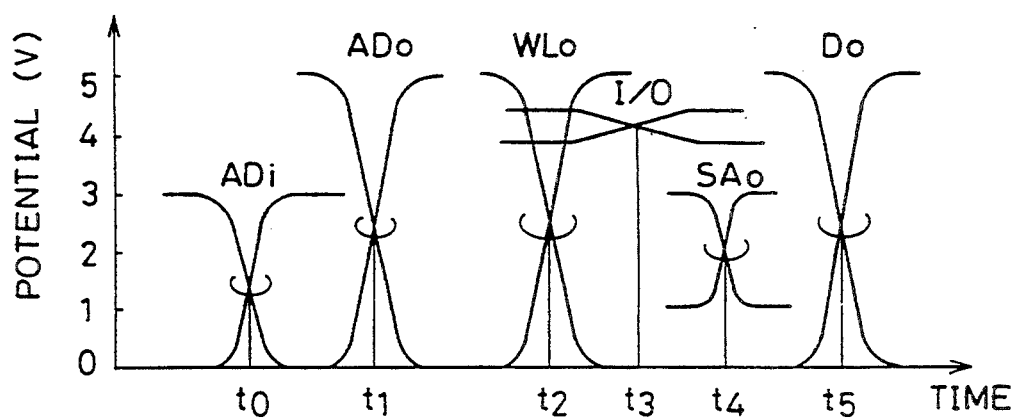
FIG. 12 is a timing chart for explaining read operation of the memory cell shown in FIG. 9.
Figure 13:
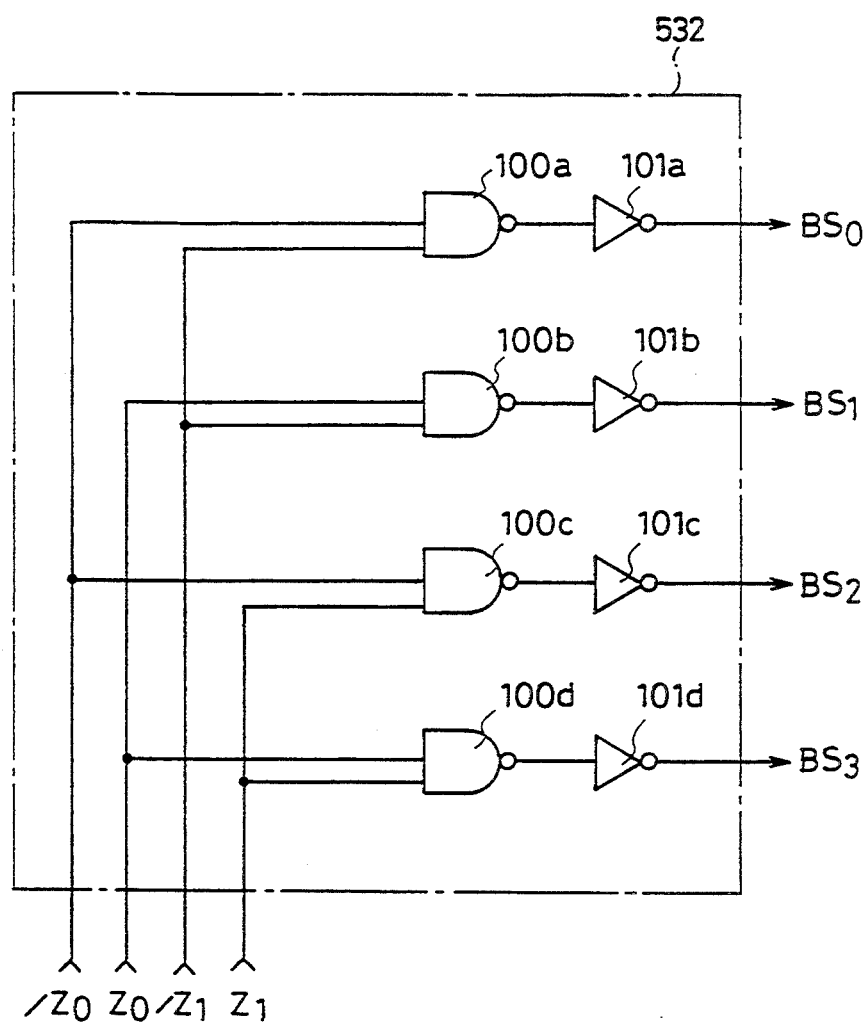
FIG. 13 is a schematic diagram of a block selector circuit shown in FIG. 8.

Referring to FIG. 1, an SRAM 100 showing the first embodiment includes memory blocks BK0 to BKn−1 each having an improved row decoder and redundancy row decoder, and an improved block selector circuit 32. Since circuit configurations other than block selector circuit 32, row decoders 3a, 3b, ... and redundancy row decoders 50a, 50b, ... are the same as those of the SRAM 500 shown in FIG. 8, the description will not be repeated.

When a redundancy memory cell row is used, respective redundancy row decoders 50a, 50b, ... provide redundancy access signals RR0 to RRn−1 equivalent to a redundancy word line signal. Redundancy access signals RR0 to RRn−1 are applied to the block selector circuit 32. The block selector circuit 32 provides block selecting signals BS0 to BSn−1, and row decoder enable signals BSL0 to BSLn−1. A sense amplifier and a write buffer provided in each of memory blocks BK0 to BKn−1 operate in response to a corresponding one of block selecting signals BS0 to BSn−1. Each of row decoders 3a, 3b, ... is enabled in response to decoder enable signals BSL0 to BSLn−1.

Figure 2:
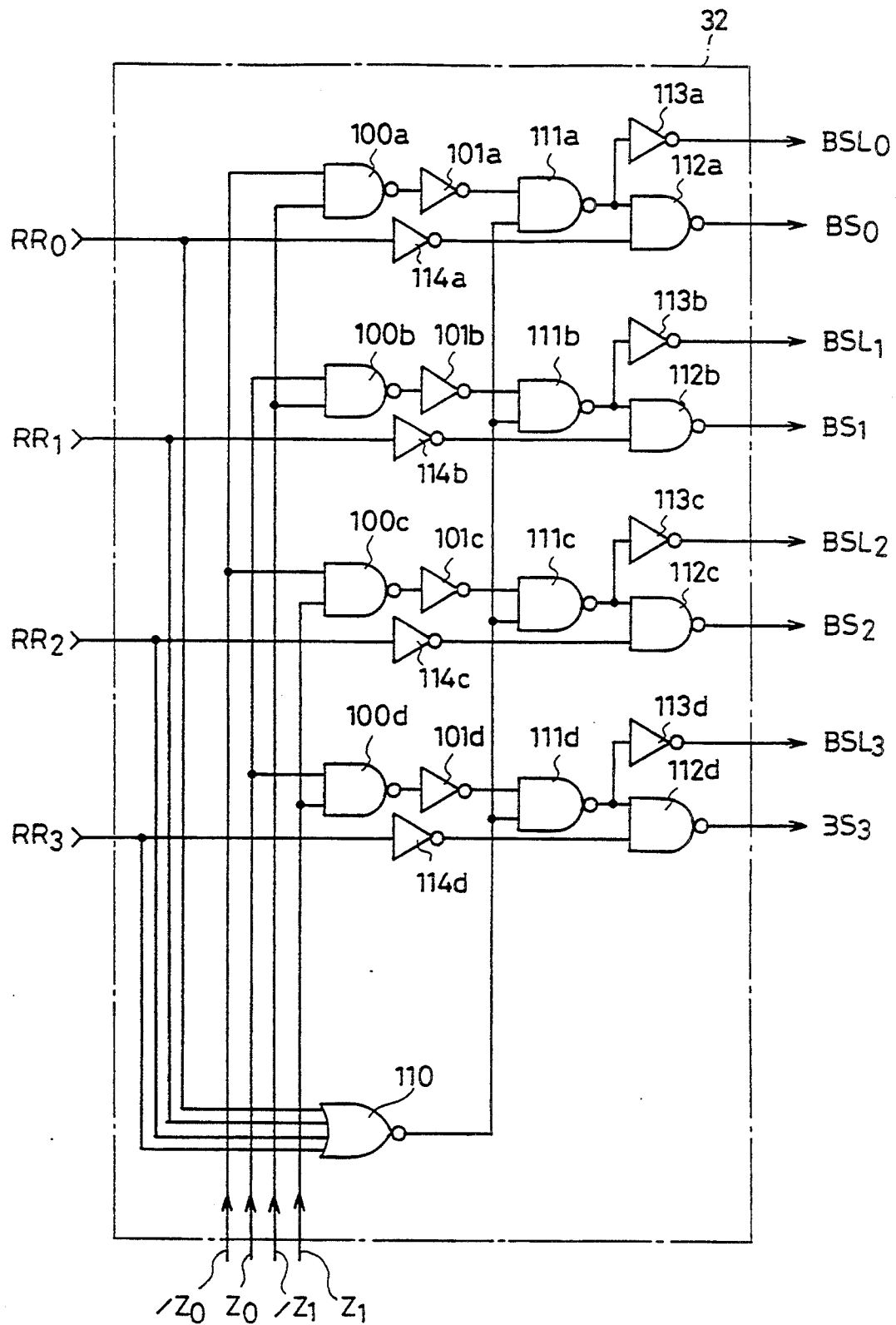
FIG. 2 is a schematic diagram of a block selector circuit shown in FIG. 1.

FIG. 2 is a schematic diagram of the block selector circuit 32 shown in FIG. 1. Referring to FIG. 2, the block selector circuit 32 includes NAND gates 100a to 100d for selectively receiving two of signals Z, /Z, Z1 and /Z1 applied from the block address buffer 31, respectively, inverters 101a to 101d, NAND gates 111a to 111d, NAND gates 112a to 112d, inverters 113a to 113d, inverters 114a to 114d, and an NOR gate 110 for receiving redundancy access signals RR0 to RR3 provided from a redundancy row decoder in each memory block. Redundancy access signals RR0 to RR3 are applied to NAND gates 112a to 112d through inverters 114a to 114d, respectively. NAND gates 112a to 112d provide block selecting signals BS0 to BS3. Output signals of NAND gates 111a to 111d are provided as signals BSL0 to BSL3, respectively, after they are inverted by inverters 113a to 113d. FIG. 2 shows only a circuit for selecting four memory blocks, for simplicity of depiction and description.

When the memory block BK0 is selected, for example, low level signals Z0 and Z1 and high level signals /Z0 and /Z1 are applied to the block selector circuit 32. Therefore, only one, 100a, of NAND gates 100a to 100d provides a low level signal. One of NAND gates 111a to 111d, the NAND gate 111a, receives signals all of high level, and provides a low level signal. The inverter 113a receives a low level signal provided from the NAND gate 111a, and provides the high level inverted signal BSL0. The NAND gate 112a also provides the high level block selecting signal BS0. The memory block BK0 shown in FIG. 1 is rendered to be operative in response to high level signals BS0 and BSL0.

Figure 3:
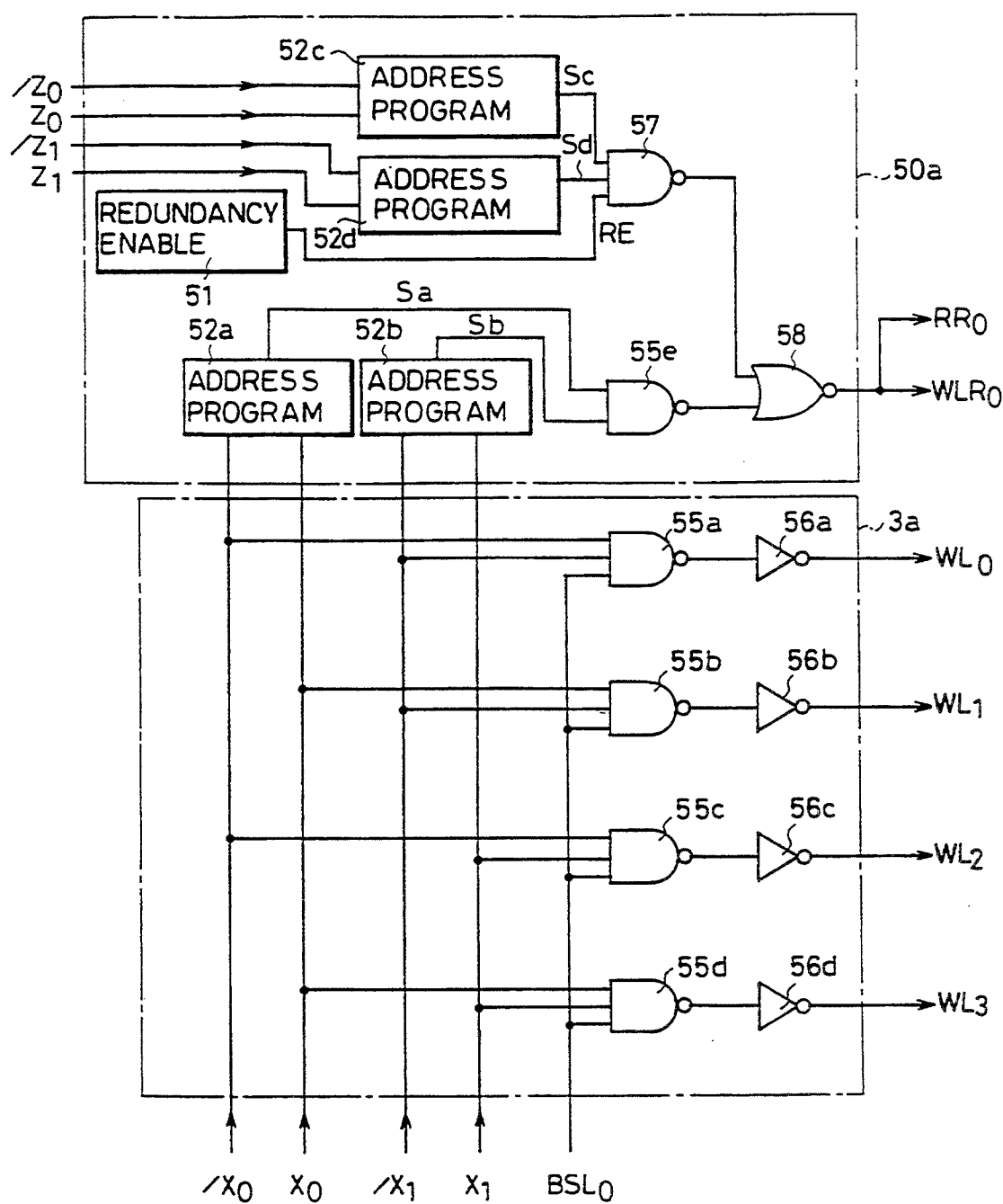
FIG. 3 is a circuit block diagram of a row decoder and a redundancy row decoder shown in FIG. 1.
Figure 14:
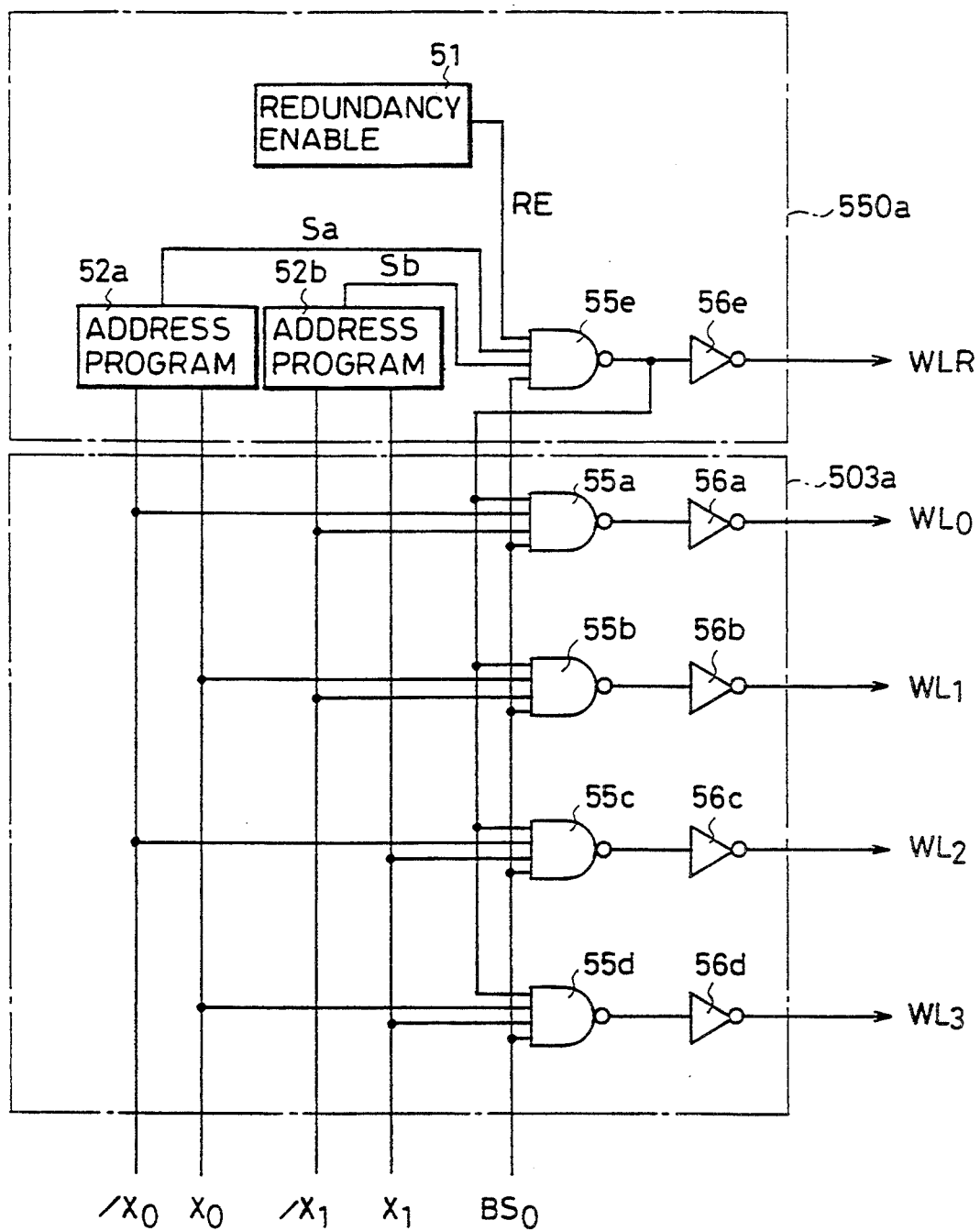
FIG. 14 is a schematic diagram of a circuit of a row decoder and a redundancy row decoder shown in FIG. 8.

FIG. 3 is a circuit block diagram of the row decoder 3a and the redundancy row decoder 50a shown in FIG. 1. Referring to FIG. 3, although the row decoder 3a has the similar circuit configuration as that of the row decoder 503a shown in FIG. 14, it is different in that an output signal of NAND gate 55e is not applied to the NAND gates 55a to 55d. In addition to this, NAND gates 55a to 55d are connected to receive the decoder enable signal BSL0 in place of the signal BS0.

The redundancy row decoder 50a includes the redundancy enable circuit 51, address program circuits 52a and 52b for programming a defect row address in which a defective memory cell exists, address program circuits 52c and 52d for programming a block address indicating a memory block having a defective memory cell, NAND gates 55e and 57, and an NOR gate 58. The NOR gate 58 provides the redundancy word line signal WLR0 and the redundancy access signal RR0 for accessing a redundancy memory cell row. It is pointed out that row decoders 3b, ... and redundancy row decoders 50b, ... provided in another blocks BK1 to BKn−1 shown in FIG. 1 have the same circuit configurations as those of the circuit shown in FIG. 3.

Figure 15:
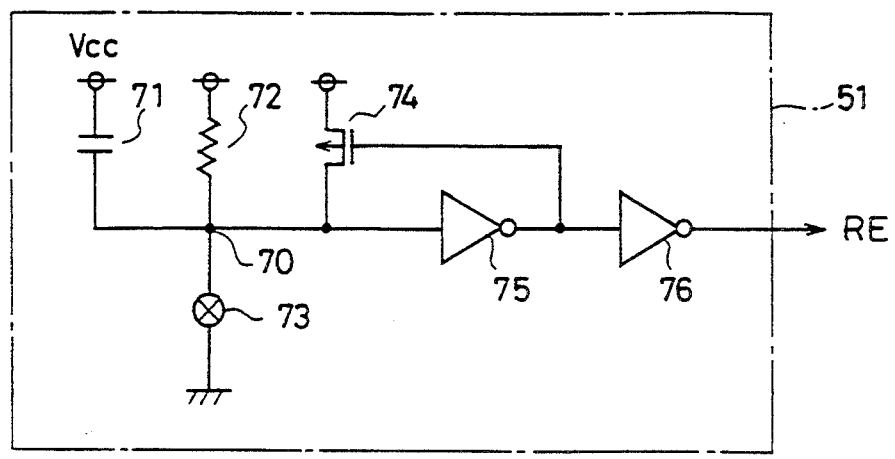
FIG. 15 is a schematic diagram of a redundancy enable circuit.
Figure 16:
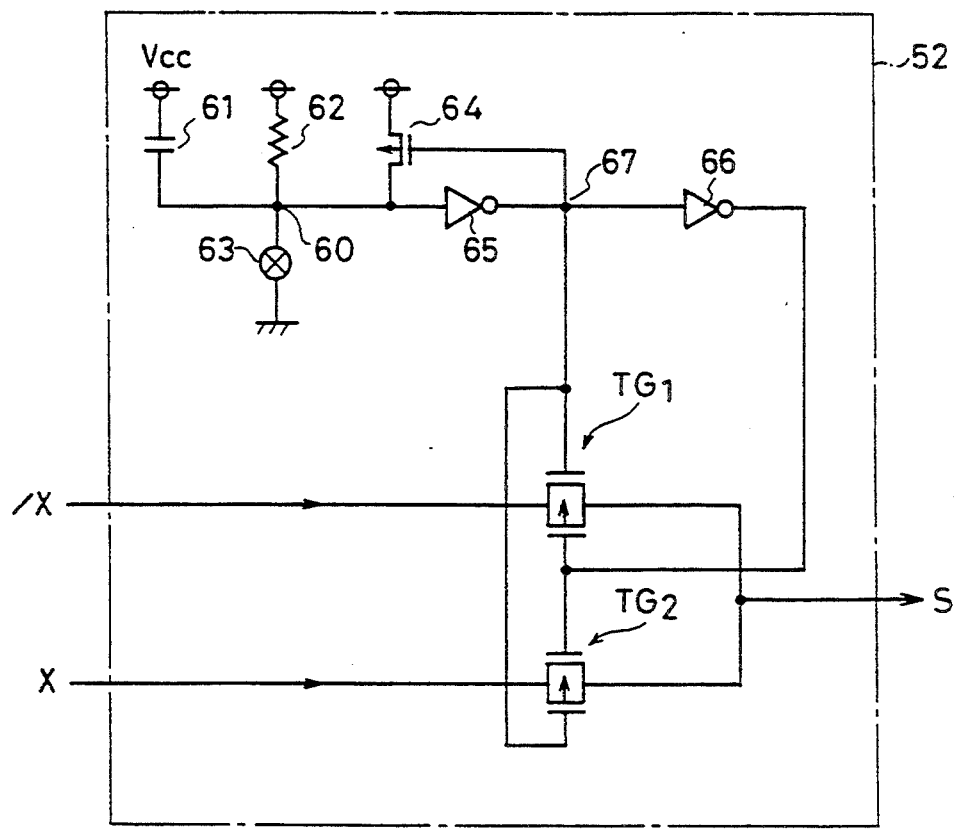
FIG. 16 is a schematic diagram of an address program circuit.
Figure 21:
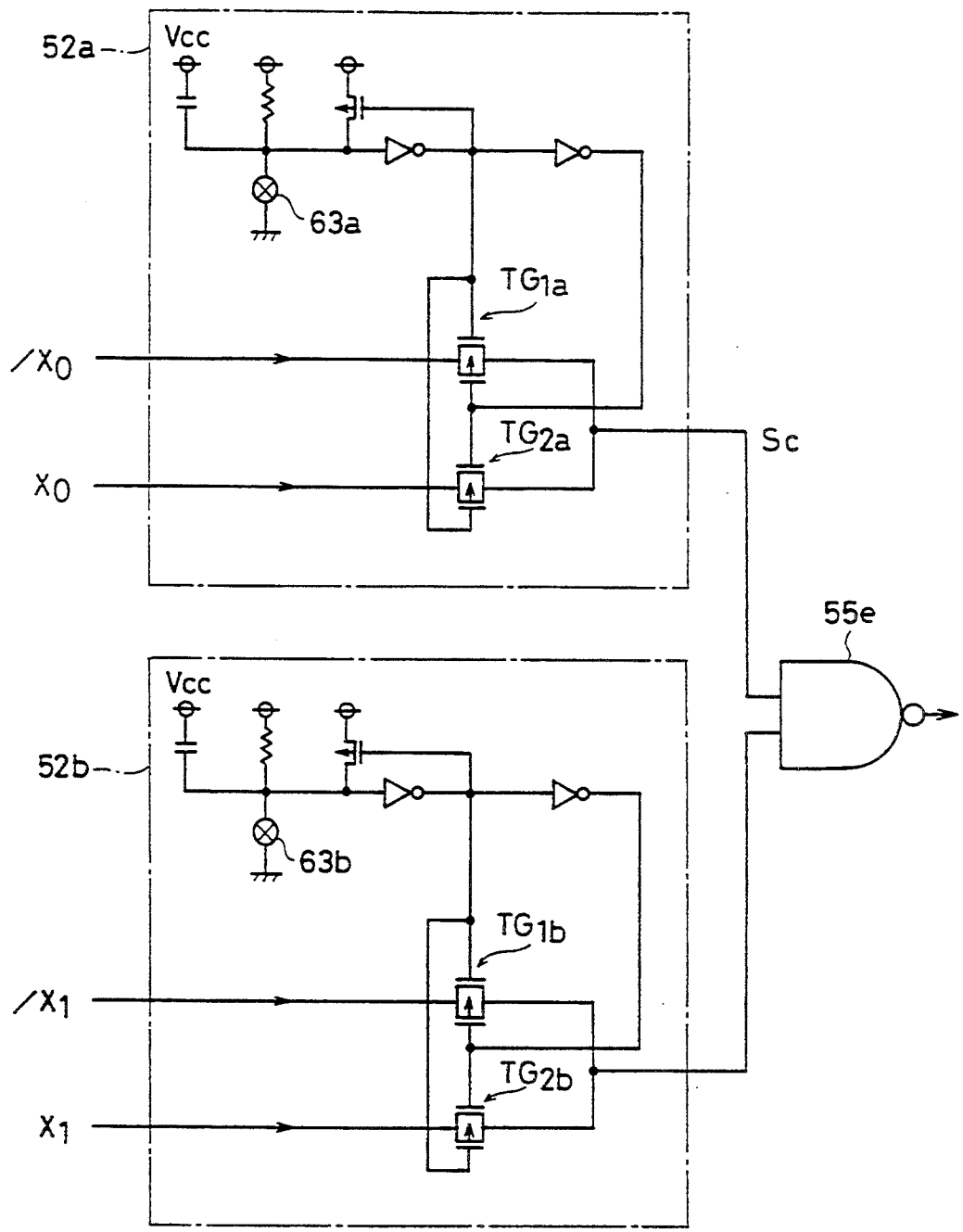
FIG. 21 is a schematic diagram of address program circuits 52a, 52b shown in FIG. 3.
Figure 22:
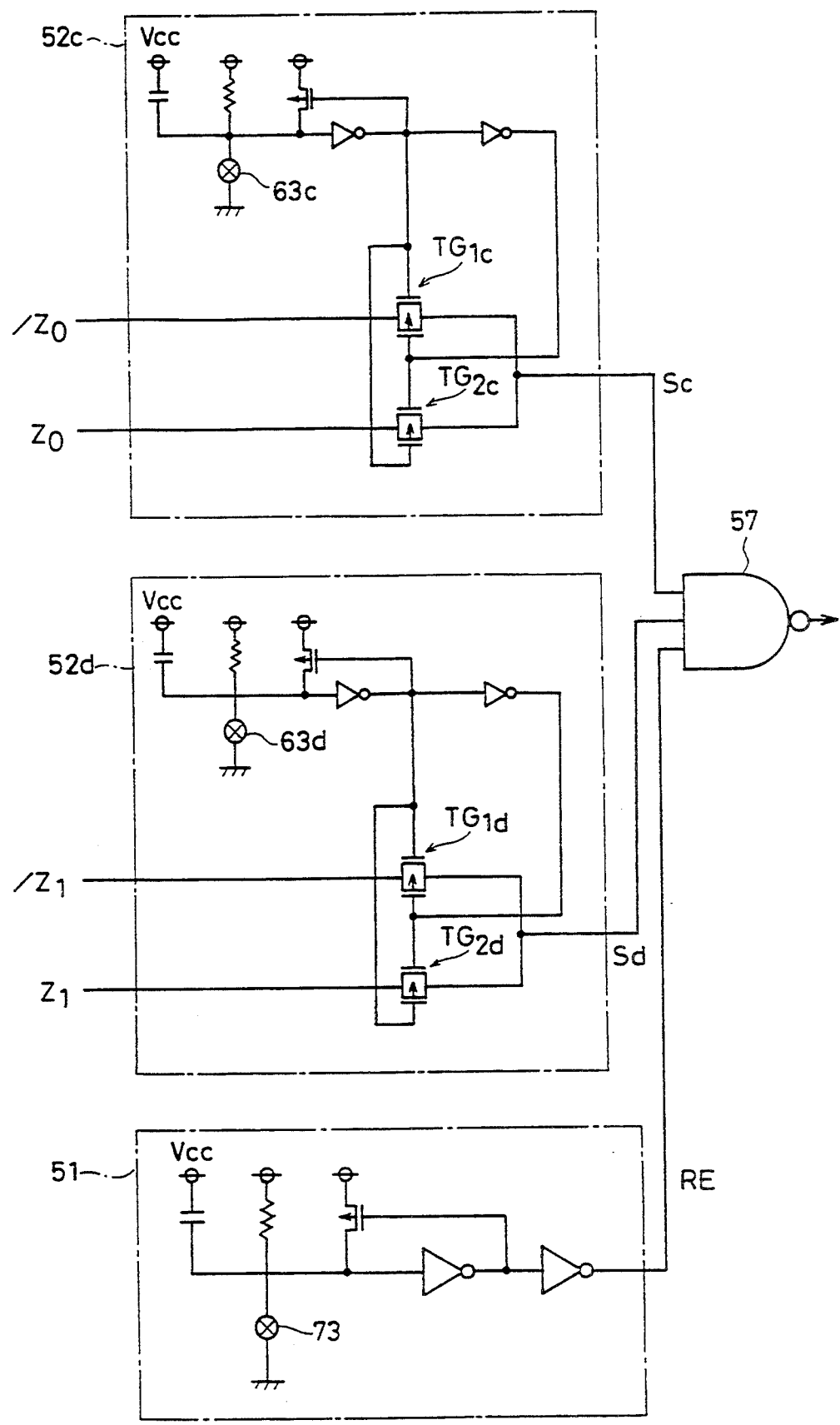
FIG. 22 is a schematic diagram of a redundancy enable circuit 51 and address program circuits 52c, 52d shown in FIG. 3.

The redundancy enable circuit 51 is implemented by the circuit 51 shown in FIG. 15. Each of address program circuits 52a, 52b, 52c and 52d is implemented by the circuit 52 shown in FIG. 16. Address program circuits 52a to 52d provide output signals Sa to Sd, respectively. The NAND gate 55e receives signals Sa and Sb. The NAND gate 57 receives the redundancy enable signal RE and signals Sc and Sd. The NOR gate 58 receives output signals of NAND gates 55e and 57. FIGS. 21 and 22 show specific circuit configurations of the address program circuits 52a to 52d and the redundancy enable circuit 51 shown in FIG. 3.

When the word line WL0 shown in FIG. 3 is activated, for example, low level signals X0 and X1 and high level signals /X0 and /X1 are applied from the row address buffer 2 to the row decoder 3a. Therefore, since only one gate 55a of NAND gates 55a to 55d provides a low level signal, only the word line WL0 is activated by operation of the inverter 56a. Other word lines WL1 to WL3 are not activated, that is, they are retained at a low level.

Operation of the circuit shown in FIG. 3 will now be described. A case where no defective memory cell exists in the memory cell array 1a will be described. In this case, connection of a fuse in the redundancy enable circuit 51 (the fuse 73 shown in FIG. 22) is retained. Therefore, the redundancy enable circuit 51 applies the low level redundancy enable signal RE to the NAND gate 57, causing the NAND gate 57 to apply a fixed high level signal to the NOR gate 58. As a result, output signals of the NOR gate 58, that is, the redundancy word line signal WLR0 and the redundancy access signal RR0 are retained at a low level. In other words, the redundancy memory cell row 7a is not accessed in this case.

When access to the memory block BK0 is requested, the high level decoder enable signal BSL0 is applied from the block selector circuit 32. NAND gates 55a to 55d are enabled by the high level signal BSL0, and operate in response to signals X0, /X0, X1 and /X1 applied from the row address buffer 2. As a result, the row decoder 3 selectively activates one of word lines WL0 to WL3 in response to the externally applied row address signal RA.

When no defective memory cell exists in all memory cell arrays 1a, 1b, . . . in memory blocks BK0 to BKn−1, that is, when any of redundancy memory cell rows 7a, 7b, . . . is not used for remedy of a defect memory cell, low level redundancy access signals RR0 to RRn−1 are provided from all redundancy row decoders 50a, 50b, . . . . The block selector circuit 32 receives all low level redundancy access signals RR0 to RRn−1.

Referring again to FIG. 2, an NOR gate 110 applies high level output signals to NAND gates 111a to 111d in response to low level redundancy access signals RR0 to RR3. Therefore, NAND gates 111a to 111d operate in response to signals Z0, /Z0, Z1, and /Z1 for block selection applied from the block address buffer 31. In other words, the block selector circuit 32 provides block selecting signals BS0 to BS3 and decoder enable signals BSL0 to BSL3 in response to the externally applied block address signal BA. In addition to this, since inverters 114a to 114d receive low level signals RR0 to RR3, high level signals are applied to NAND gates 112a to 112d, thereby enabling NAND gates 112a to 112d.

Operation of the redundancy circuit will now be described. In particular, a case where a defective memory cell row in the memory cell array 1b in the memory block BK1 is remedied by using the redundancy memory cell row 7a in the memory block BK0 will be described.

Referring again to FIG. 3, a fuse of the redundancy enable circuit 51 in the redundancy row decoder 50a, that is, the fuse 73 in the circuit 51 shown in FIG. 15, is first disconnected. Therefore, since the redundancy enable circuit 51 provides the high level redundancy enable signal RE, the NAND gate 57 operates in response to output signals Sc and Sd from address program circuits 52c and 52d.

Next, a memory block in which a defective memory cell row exists, that is, a block address defining memory block BK1 to be remedied, is programmed by using address program circuits 52c and 52d. The memory block BK1 is selected by the block selector circuit 32 when high level signals Z0 and /Z1 are applied. Therefore, address program circuits 52c and 52d are programmed to provide high level signals Sc and Sd when high level signals Z0 and /Z1 are applied. More specifically, a fuse in the address program circuit 52d (which corresponds to the fuse 63d in FIG. 22) is left connected, and a fuse 63c in the address program circuit 52c is disconnected. As a result, address program circuits 52c and 52d provide high level signal Sc and high level signal Sd only when high level signals Z0 and /Z1 are applied.

When signals Z0 and /Z1 are at a high level, the NAND gate 57 receives all high level signals RE, Sc and Sd, and applies a low level signal to the NOR gate 58. Therefore, the NOR gate 58 is rendered to be operative in response to an output signal from the NAND gate 55e.

Assuming that a defective memory cell row to be remedied by the redundancy memory cell row 7a is a circuit to be connected to the first word line WL0 in the memory cell array 1b, programming of a defective row address defining the defective memory cell row in the memory cell array 1b is carried out using address program circuits 52a and 52b, as described hereinafter. In this example, programming is carried out by leaving fuses (the fuses 63a and 63b shown in FIG. 21) connected in both address program circuits 52a and 52b. As a result, address program circuits 52a and 52b applies signals Sa and Sb respectively of high level to the NAND gate 55e only when high level signal /X0 and high level signal /X1 are applied. Therefore, the NAND gate 55e provides a low level signal only when signals /X0 and /X1 respectively of high level are applied, that is, only when activation of the word line WL0 is requested.

As a result, the NOR gate 58 provides the high level redundancy word line signal WLR0 and the high level redundancy access signal RR0 in response to low level signals provided from NAND gates 55e and 57. The redundancy memory cell row 7a shown in FIG. 1 is accessed in response to the high level redundancy word line signal WLR0.

It has been described above that access to the redundancy memory cell row 7a in the memory block BK0 is carried out by activation of the word line WLR0 when access to a defective memory cell row in the memory cell array 1b is requested. Description will be given hereinafter of operation for disabling in the memory block BK1 a request for access to a defective memory cell row in the memory cell array 1b.

Referring again to FIG. 2, in this case, the high level redundancy access signal RR0 is applied from the redundancy row decoder 50a shown in FIG. 3. The NOR gate 110 applies low level signals to NAND gates 111a to 111d in response to the high level signal RR0. Therefore, NAND gates 111a to 111d are disabled. In other words, NAND gates 111a to 111d are not rendered to be operative in response to signals Z0, /Z0, Z1 and /Z1 for block selection, and all of them provide high level signals. As a result, all row decoders 3a to 3c are disabled because inverters 113a to 113d provide low level decoder enable signals BSL0 to BSL3.

In addition to this, the NAND gate 112a receives a low level signal applied from the NAND gate 111a and a low level signal provided from the inverter 114a to supply the high level block selecting signal BS0 as an output. Therefore, the sense amplifier 9a and the write buffer 33a in the memory block BK0 are activated or enabled in response to the block selecting signal BS0. In other words, since the redundancy word line WLR0 is activated by the redundancy row decoder 50a, the sense amplifier 9a and the write buffer 33a are also activated or enabled in order to accomplish access of the redundancy memory cell row 7a.

As described above, when access to a defective memory cell row in the memory block BK1 is requested, the redundancy memory cell row 7a in the memory block BK0 is accessed by operation of the block selecting circuit 32 and the redundancy row decoder 50a. In other words, it is understood that, by using the redundancy memory cell row 7a in one memory block, a defective memory cell row in the other memory block BK1 can be remedied.

Figure 4:
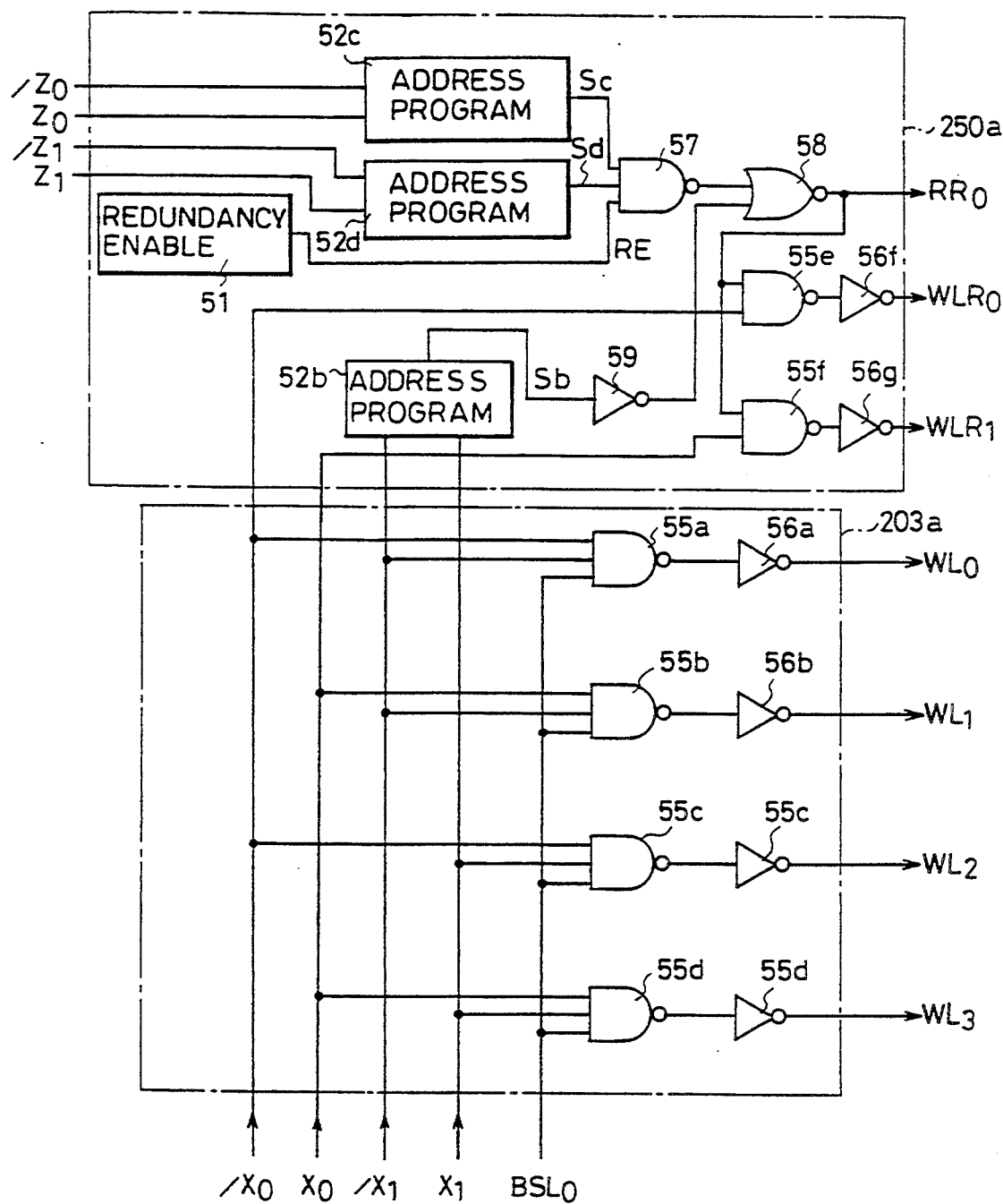
FIG. 4 is a circuit block diagram of a row decoder and a redundancy row decoder for use in an SRAM of a second embodiment of the present invention.

FIG. 4 is a circuit block diagram of a row decoder and a redundancy row decoder for use in an SRAM showing the second embodiment of the present invention. When the row decoder 3a and the redundancy row decoder 50a shown in FIG. 3 were applied to an SRAM, one redundancy memory cell row was used for remedy of a defective memory cell row. In the embodiment shown in FIG. 4, two redundancy memory cell rows can be used for remedying two defective memory cell rows. While both a row decoder 203a and a redundancy row decoder 250a shown in FIG. 4 are provided in the memory block BK0, the similar row decoder and redundancy row decoder are provided in other memory blocks BK1 to BKn−1.

Referring to FIG. 4, description will not be repeated since the row decoder 203a has the same circuit configuration as that of the row decoder 3a shown in FIG. 3 and operates in the similar manner. Compared with the redundancy row decoder 50a shown in FIG. 3, the redundancy row decoder 250a excludes the address program circuit 52a, while it includes additionally an NAND gate 55f, inverters 56f, 56g and 59.

Description will be given of operation when two defect memory cell rows exist in the memory block BK1, and these rows are remedied by the function of the redundancy row decoder 250a. Since a fuse in the redundancy enable circuit 51 is first disconnected, the high level redundancy enable signal RE is applied to the NAND gate 57. Address program circuits 52c and 52d are programmed in the same way as address program circuits 52c and 52d shown in FIG. 3. Therefore, when the block address signal BA requesting access to the memory block BK1 is applied externally, that is, when high level signals Z0 and /Z1 are applied, address program circuits 52c and 52d provide high level signals Sc and Sd. Therefore, the NAND gate 57 applies a low level signal to the NOR gate 58 in response to high level signals RE, Sc and Sd.

Assuming that respective defective memory cells exist in memory cell rows to be accessed by the first two word lines WL0 and WL1 in the memory cell array 1b, the address program circuit 52b is programmed by leaving a fuse (the fuse 63 shown in FIG. 16) connected. Therefore, the address program circuit 52b applies a high level signal Sb to the inverter 59 when a high level signal /S1 is applied. Therefore, when a high level signals /X1 is applied, in other words, when access to a memory cell row connected to word line WL0 or WL1 is requested, the NOR gate 58 receives two signals of low level, and provides a high level redundancy access signal RR0.

NAND gates 55e and 55f are enabled in response to a high level signal provided from the NOR gate 58. In other words, NAND gates 55e and 55f are rendered to be operative in response to signals X0 and /X0, respectively. Since the NAND gate 55e provides a low level signal when a signal /X0 is at a high level, the redundancy word line WLR0 is activated. On the other hand, when the signal X0 is at a high level, the NAND gate 55f provides a low level signal, thereby activating the redundancy word line WLR1. This means two defective memory cell rows in the memory cell array 1b have been remedied by two redundancy memory cell rows in the memory block BK0.

Since the high level redundancy access signal RR0 is applied to the block selector circuit 32 shown in FIG. 2, the sense amplifier 9a and the write buffer 33a in the memory block BK0 are activated or enabled in response to the block selecting signal BS0, similarly to the case of the first embodiment. In addition to this, all row decoders in all memory blocks BK0 to BKn−1 are disabled in response to low level decoder enable signals BSL0 to BSL3.

FIG. 23 is a block diagram showing the third embodiment of the present invention. Referring to FIG. 23, although an SRAM 100′ includes n memory blocks, for simplicity of description, only four memory blocks BK0 to BK3 are shown. In the first embodiment shown in FIG. 1, one of redundancy row decoders (RRD) 50a, 50b, . . . and one of row decoders 3a, 3b, . . . are provided for each of the memory blocks BK0 to BKn−1, respectively, while in the third embodiment, one redundancy row decoder and one row decoder are provided for two memory blocks. In other words, a redundancy row decoder 350a shown in FIG. 23 is provided for controlling access to redundancy memory cell rows 7a and 7b in memory blocks BK0 and BK1. A row decoder 351A is provided for accessing memory cell arrays 1a and 1b. Similarly, a redundancy row decoder 350B is provided for controlling access to redundancy memory cell rows 7c and 7d in memory blocks BK2 and BK3. A row decoder 351B is provided for accessing memory cell arrays 1c and 1d. An improved block selector circuit 332 is provided for controlling operations of the redundancy row decoders 350A and 350B and the row decoders 351A and 351B.

Figure 5:
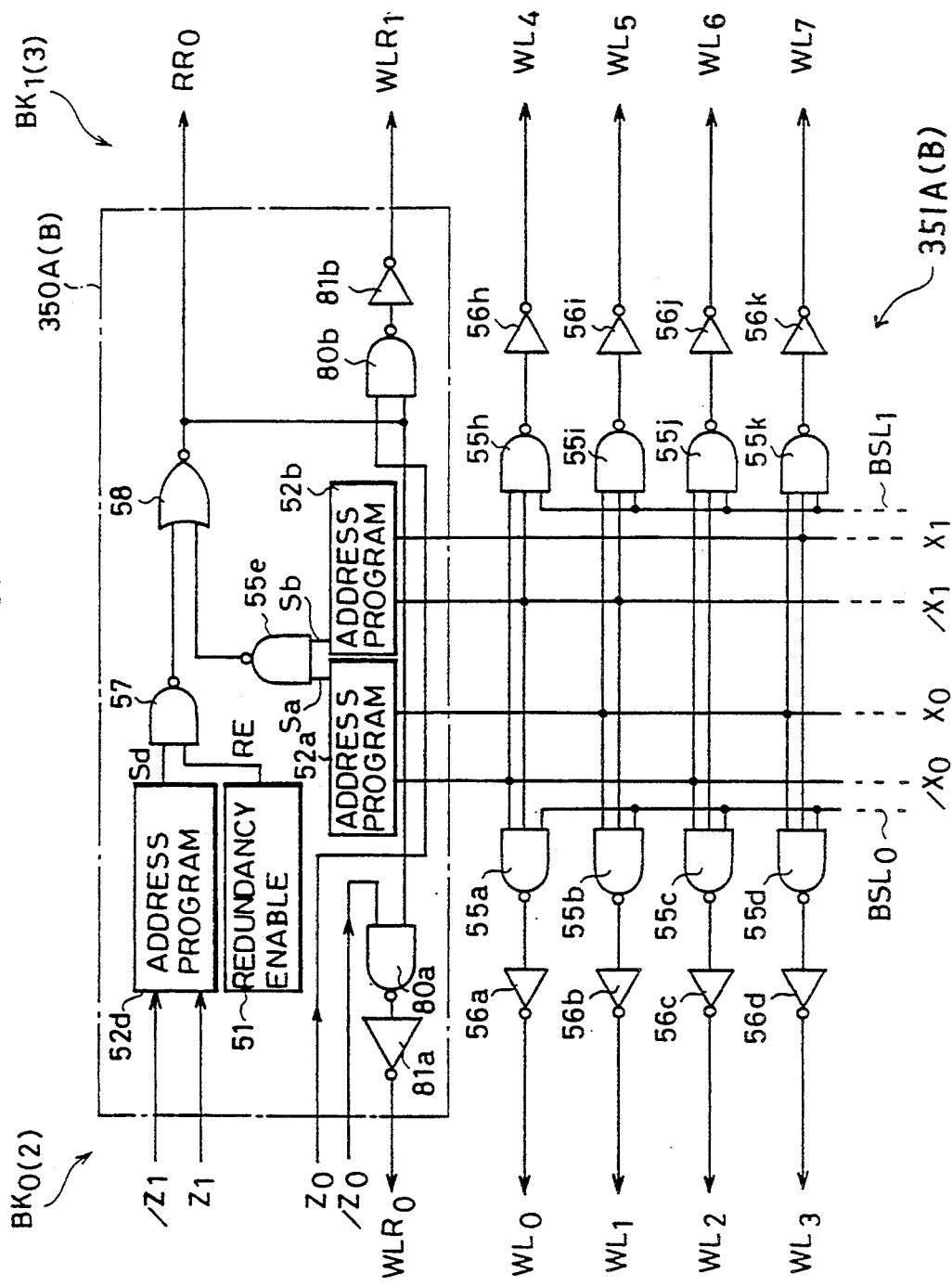
FIG. 5 is a schematic diagram of a circuit of a row decoder and a redundancy row decoder for use in an SRAM of a third embodiment of the present invention.

FIG. 5 is a schematic diagram of a circuit of a row decoder and a redundancy row decoder for use in an SRAM of the third embodiment of the present invention. Referring to FIG. 5, one redundancy row decoder 350A is provided for two memory blocks BK0 and BK1. Redundancy row decoder 350B is provided for memory blocks BK2 and BK3. Redundancy row decoders 350A and 350B have the same circuit configuration. In each of memory blocks BK0 to BK3, the same circuit configuration is provided including a row decoder.

Referring to FIG. 5, the redundancy row decoder 350A includes the redundancy enable circuit 51, address program circuits 52a and 52b for programming a defect memory cell row to be remedied, one address program circuit 52d for programming a memory block to be remedied, NAND gates 55e, 57, 80a and 80b, the NOR gate 58, and inverters 81a and 81b.

The address program circuit 52a receives signals X0 and /X0 from the row address buffer 2. The address program circuit 52b receives signals X1 and /X1 from the row address buffer 2. The address program circuit 52d receives signals Z1 and /Z1 from the block address buffer 31. The NOR gate 58 generates the redundancy access signal RR0 (or RR2). An output of the inverter 81a is connected to the redundancy word line WLR0 for activating a first redundancy memory cell row. An output of the inverter 81b is connected to the redundancy word line WLR1 for accessing a second redundancy memory cell row.

NAND gates 55a to 55d and inverters 56a to 56d configure a row decoder for accessing the memory block BK0 (or BK2). NAND gates 55h to 55k and inverters 56h to 56k configure a row decoder for accessing the memory block BK1 (or BK3).

Figure 6:
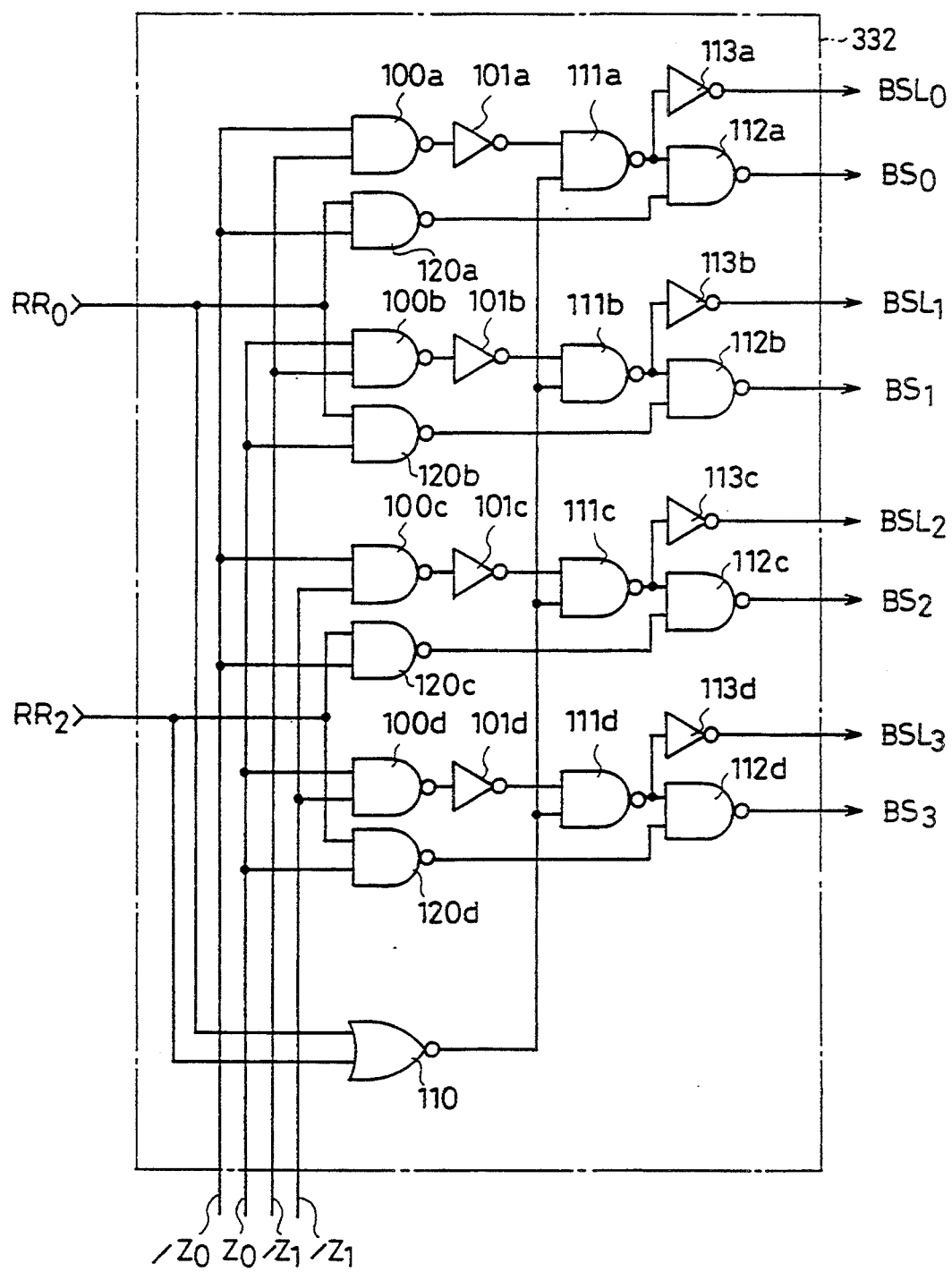
FIG. 6 is a schematic diagram of a block selector circuit for use in an SRAM of the third embodiment of the present invention.

FIG. 6 is a schematic diagram of a block selector circuit for use in an SRAM of the third embodiment of the present invention. Referring to FIG. 6, a block selector circuit 332 receives redundancy access signals RR0 and RR2 from redundancy row decoders 350A and 350B shown in FIG. 5. In addition to this, the block selecting circuit 332 generates block selecting signals BS0 to BS3 and decoder enable signals BSL0 to BSL3 in response to signals X0, /X0, X1 and /X1 for block selection applied from a block address buffer.

Operation of the third embodiment will now be described. As one example, description will be given of a case where a memory cell row connected to the word line WL0 in the memory block BK0 is remedied by the redundancy memory cell row WLR0 connected to the redundancy word line WLR0 in the memory block BK2, and where a memory cell row connected to the word line WL1 in the memory block BK1 is remedied by a redundancy memory cell row connected to the redundancy word line WLR1 in the memory block BK3.

In the redundancy row decoder 350B for the memory blocks BK2 and BK3, the corresponding fuse 63 in each of address program circuits 52a, 52b and 52d is left connected. Therefore, when signals X0, X1 and Z1 are at a low level, a high level redundancy access signal RR2 is provided independent of a signal Z0. In addition to this, the block selector circuit 332 provides decoder enable signals BSL0 to BSL3 all of low level. Therefore, no row decoders are rendered to be operative at this time.

When a signal /Z0 is at a high level, the NAND gate 80a provides a low level signal, while the NAND gate 80b provides a high level signal. Therefore, the inverter 81a provides a high level redundancy word line signal WLR0, and the inverter 81b provides a low level redundancy word line signal WLR1. As a result, a redundancy memory cell row in the memory block BK2 is accessed in response to the activated redundancy word line signal WLR0. In other words, a redundancy memory cell row in the memory block BK2 is accessed in place of a memory cell row to be accessed by the word line WL0 in the memory block BK0.

On the other hand, since a high level redundancy access signal RR2 is provided from the redundancy row decoder 350B at this time, the NAND gate 111c provides a low level signal. As a result, a high level block selecting signal BS2 is provided, while low level block selecting signals BS0, BS1 and BS3 are provided, whereby a sense amplifier and a write driver in the block BK2 are activated or enabled.

When the signal Z0 applied from the block address buffer 31 is at a high level, the NAND gate 80a provides a high level signal, and the NAND gate 80b provides a low level signal. Therefore, the inverter 81a provides the redundancy word line signal WLR0 of a low level, while the inverter 81b provides the redundancy word line signal WLR1 of a high level. As a result, a redundancy memory cell row in the memory block BK3 is accessed in response to the activated redundancy word line signal WLR1.

Since the redundancy access signal RR2 provided from the redundancy row decoder 350B is at a high level, the NAND gate 111d shown in FIG. 6 provides a low level signal. Therefore, only a block selecting signal BS3 attains a high level, causing other block selecting signals BS0, BS1 and BS2 to attain a low level. As a result, only a sense amplifier and a write driver in the memory block BK3 are activated or enabled.

By the operation described above, a memory cell row to be accessed by the word line WL0 in the memory block BK0 was replaced with a redundancy memory cell row in the memory block BK2, and a memory cell row to be accessed by the word line WL1 in the memory block BK1 was replaced with a redundancy memory cell row in the memory block BK3. As can be seen from FIG. 5, an address program circuit for programming the signal Z0 for block selection is omitted, thereby bringing about an advantage that an area occupied by a program circuit on a semiconductor substrate is reduced.

Figure 7:
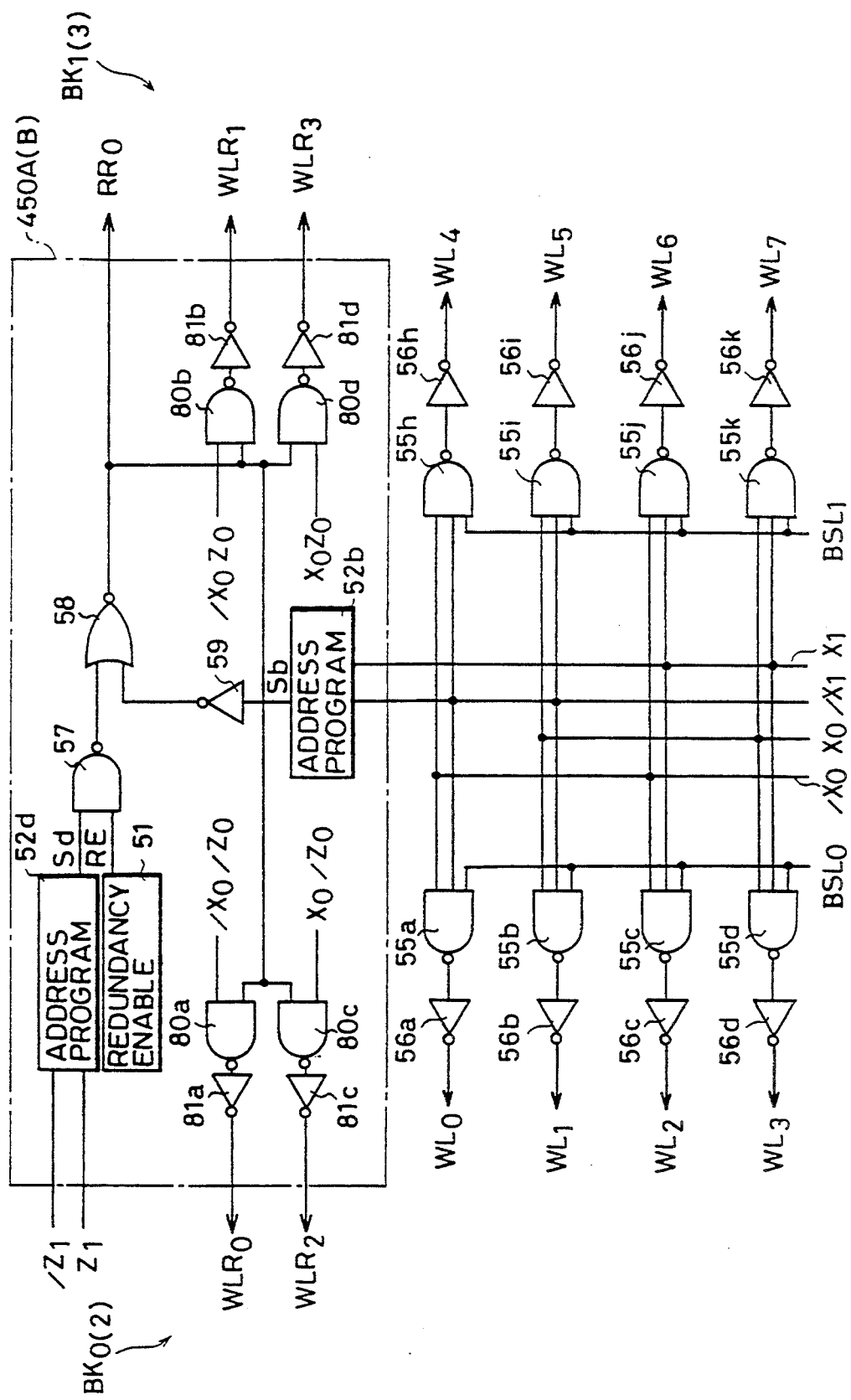
FIG. 7 is a schematic diagram of a circuit of a row decoder and a redundancy row decoder for use in an SRAM of a fourth embodiment of the present invention.

FIG. 7 is a schematic diagram of a circuit of a row decoder and a redundancy row decoder for use in an SRAM of the fourth embodiment of the present invention. In this embodiment, two redundancy memory cell rows are provided in each of memory blocks BK0 to BK3. For example, referring to FIG. 7, the memory block BK0 (or BK2) is provided with two redundancy memory cell rows accessed in response to redundancy word line signals WLR0 and WLR2. The memory block BK1 (or BK3) is provided with two redundancy memory cell rows accessed in response to redundancy word line signals WLR1 and WLR3. Also in this embodiment, one redundancy row decoder 450A is provided for controlling redundancy memory cell rows in two memory blocks BK0 and BK1. Similarly, the redundancy row decoder 450B is provided for controlling redundancy memory cell rows in memory blocks BK2 and BK3. It is pointed out that redundancy row decoders 450A and 450B have the same circuit configuration.

The redundancy row decoder 450A includes the redundancy enable circuit 51, the address program circuit 52b for programming a defect memory cell row to be remedied, the address program circuit 52d for programming a memory block to be remedied, NAND gates 57 and 80a to 80d, the NOR gate 88, and inverters 59 and 81a to 81d. Outputs of inverters 81a to 81d are connected to redundancy word lines WLR0, WLR2, WLR1 and WLR3, respectively. The NAND gate 80a receives predecoding signal /X0/Z0. The NAND gate 80c receives predecoding signal X0/Z0. The NAND gate 80b receives predecoding signal /X0Z0. The NAND gate 80d receives predecoding signal X0Z0. The address program circuit 52b receives signals X1 and /X1 applied from the row address buffer 2. The address program circuit 52d receives signals Z1 and /Z1 applied from the block address buffer 31.

Operations of the fourth embodiment will now be described. As an example, operation will be given of a case where a memory cell row accessed by a word line WL0 in a memory block BK0 is remedied by a redundancy memory cell row connected to a redundancy word line WLR0 in a memory block 2, where a memory cell row accessed by a word line WL1 in a memory block BK0 is remedied by a redundancy memory cell row connected to a redundancy word line WLR2 in a memory block BK2, where a memory cell row accessed by a word line WL4 in a memory block BK1 is remedied by a redundancy memory cell row connected to a redundancy word line WLR1 in a memory block BK3, and where a memory cell row accessed by a word line WL5 in a memory block BK1 is remedied by a redundancy memory cell row connected to a redundancy word line WLR3 in a memory block 3.

In the redundancy row decoder 450B for memory blocks BK2 and BK3, the corresponding fuse 63 in each of address program circuits 52b and 52d is left connected. Therefore, the NOR gate 58 provides a high level redundancy access signal RR2 when both signals X1 and Z1 are at a low level. Since the block selector circuit (which is also used in this embodiment) 332 shown in FIG. 6 provides decoder enable signals BSL0 to BSL3 respectively of a low level, no row decoders are rendered to be operative at this time.

When the signals /Z0 is at a high level, the NAND gate 80a provides a low level signal, while the NAND gate 80b provides a high level signal. Therefore, the inverter 81a provides the redundancy word line signal WLR0 of a high level, and the inverter 81b provides the redundancy word line signal WLR2 of a low level. As a result, one redundancy memory cell row in the memory block BK2 is accessed in response to the activated redundancy word line signal WLR0.

On the other hand, in the block selector circuit 332, the NAND gate 111c provides a low level signal in response to the redundancy access signal RR2 of a high level applied from the redundancy row decoder 450B. Therefore, only the block selecting signal BS2 attains a high level, and other block selecting signals BS0, BS1 and BS3 attain a low level. As a result, only a sense amplifier and a write driver in the memory block BK2 are activated or enabled.

When the signal Z0 is at a high level, the NAND gate 80a provides a high level signal, while the NAND gate 80b provides a low level signal. Therefore, the inverter 81a provides the redundancy word line signal WLR0 of a low level, while the inverter 80b provides the redundancy word line signal WLR1 of a high level. As a result, one redundancy memory cell row in the memory block BK3 is accessed in response to the activated redundancy word line signal WLR1.

In the block selector circuit 332, since the redundancy access signal RR2 of a high level is applied, the NAND gate 111d provides a low level signal. Therefore, only the block selecting signal BS3 attains a high level, and other block selecting signals BS0, BS1 and BS2 attain a low level. As a result, only a sense amplifier and a write driver in the memory block BK3 are activated or enabled.

By the operation described above, two memory cell rows accessed by word lines WL0 and WL1 in the memory block BK0 were replaced with two redundancy memory cell rows in the memory block BK2, and two memory cell rows accessed by word lines WL4 and WL5 in the memory block BK1 were replaced with two redundancy memory cell rows in the memory block BK3.

As can be understood from the above description, the yield rate in production of SRAMs can be improved, since a redundancy memory cell provided for each memory block can be used for remedy of a defective memory cell in any memory block. In other words, a defective memory cell can be remedied flexibly, since a redundancy memory cell provided in each memory block can be shared by all memory blocks for remedy of a defective memory cell.

In addition, since defects in a semiconductor memory tend to be generated in adjacent rows in a memory cell array, remedy for every adjacent memory cell rows as shown in FIGS. 18 and 20 is quite useful. In other words, in the second and the fourth embodiments, since adjacent defective memory cell rows can be replaced with a plurality of redundancy memory cell rows, effective remedy of a semiconductor memory can be implemented. Simultaneously, in the embodiments where adjacent defective rows are remedied, since the number of address program circuits is reduced (for example, comparison of the redundancy row decoders 50a and 250a shown in FIGS. 3 and 4 shows that the address program circuit 52a is omitted in the redundancy row decoder 250a), higher integration density can be accomplished.

Although the examples where the present invention is applied to an SRAM are shown in the above-described embodiments, it is pointed out that the present invention can be applied not only to an SRAM but also to general semiconductor memories.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a plurality of memory blocks each including a memory cell array, and first and second redundancy memory cell rows; and
   a plurality of redundancy access control circuits each provided for said first and second redundancy memory cell rows in a corresponding one of the memory blocks and controlling access to the corresponding first and second redundancy memory cell rows; wherein
   each redundancy access control circuit provided for said first and second redundancy memory cell rows in the corresponding one of the memory blocks includes means for functionally simultaneously replacing two adjacent memory cell rows in a memory cell array in a memory block other than said corresponding one of the memory blocks containing said corresponding first and second redundancy memory cell rows used for functionally replacing two adjacent memory cell rows.

2. A semiconductor memory device, comprising:
   a plurality of memory blocks each including a memory cell array and a redundancy memory cell row; and
   a plurality of redundancy access control circuits each provided for corresponding two of the redundancy memory cell rows in corresponding two of the memory blocks and controlling access to said two of the redundancy memory cell rows; wherein
   each redundancy access control circuit provided for said corresponding two redundancy memory cell rows in said corresponding two of the memory blocks includes means for functionally simultaneously replacing two memory cell rows each located in a memory cell array in two memory blocks other than said corresponding two memory blocks containing the two redundancy memory cell rows used for functionally replacing two memory cell rows.

3. A semiconductor memory device, comprising:
   a plurality of memory blocks each including a memory cell array and first and second redundancy memory cell rows;
   a plurality of redundancy access control circuits each provided for corresponding four of the redundancy memory cell rows in corresponding two memory blocks and controlling access to the corresponding four redundancy memory cell rows; wherein
   each redundancy access control circuit provided for said corresponding four redundancy memory cell rows in said corresponding two memory blocks includes means for functionally simultaneously replacing two sets of two adjacent memory cell rows in two memory cell arrays in two memory blocks other than said corresponding two memory blocks containing the four redundancy memory cell rows used for functionally replacing four memory cell rows.

* * * * *